US007239007B2

(12) United States Patent
Ohki

(10) Patent No.: US 7,239,007 B2
(45) Date of Patent: Jul. 3, 2007

(54) BIPOLAR TRANSISTOR WITH DIVIDED BASE AND EMITTER REGIONS

(75) Inventor: Masaru Ohki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 236 days.

(21) Appl. No.: 10/206,055

(22) Filed: Jul. 29, 2002

(65) Prior Publication Data

US 2003/0020140 A1 Jan. 30, 2003

(30) Foreign Application Priority Data

Jul. 27, 2001 (JP) ............................. 2001-227356

(51) Int. Cl.
H01L 29/00 (2006.01)
H01L 27/082 (2006.01)
(52) U.S. Cl. ..................... 257/561; 257/560; 257/563; 257/564; 257/578; 257/579
(58) Field of Classification Search ........ 257/560–565, 257/584, 578–579
See application file for complete search history.

(56) References Cited

U.S. PATENT DOCUMENTS

| 3,560,814 | A | * | 2/1971 | Engbert et al. ............. 257/579 |
| 3,702,955 | A | * | 11/1972 | Kalb et al. .................. 257/541 |
| 3,704,398 | A | | 11/1972 | Fukino |
| 3,895,977 | A | | 7/1975 | Sanders |
| 4,119,997 | A | * | 10/1978 | Fulkerson ................... 257/564 |
| 4,297,597 | A | * | 10/1981 | Kimura ....................... 327/575 |
| 4,370,670 | A | * | 1/1983 | Nawata et al. .............. 257/580 |
| 4,513,306 | A | | 4/1985 | Davies |
| 4,656,496 | A | * | 4/1987 | Widlar ........................ 257/567 |
| 5,138,417 | A | * | 8/1992 | Noda ........................... 257/563 |
| 5,387,813 | A | * | 2/1995 | Iranmanesh et al. ........ 257/563 |
| 5,907,180 | A | * | 5/1999 | Johansson et al. .......... 257/580 |
| 6,015,982 | A | * | 1/2000 | Soderbarg ................... 257/262 |
| 6,236,072 | B1 | * | 5/2001 | Tilly et al. .................. 257/197 |
| 6,461,927 | B1 | * | 10/2002 | Mochizuki et al. ......... 438/369 |

FOREIGN PATENT DOCUMENTS

| EP | 0 029 369 | 5/1981 |
| FR | 2 634 948 | 2/1990 |
| JP | A 60-227471 | 11/1985 |
| JP | A 61-194774 | 8/1986 |
| JP | 62-14456 | 1/1987 |
| JP | A 2-5431 | 1/1990 |
| JP | 02-250369 | 10/1990 |
| JP | 6-224214 | 8/1994 |
| JP | A 8-130222 | 5/1996 |

OTHER PUBLICATIONS

M. Schroter, "RF-Modeling of Bipolar Transistors with HICUM," University of Technology, Dresden, Germany (2000), p. 15.*

* cited by examiner

*Primary Examiner*—Ori Nadav
(74) *Attorney, Agent, or Firm*—Young & Thompson

(57) ABSTRACT

A modified bipolar transistor defined for providing a larger emitter current than a basic emitter current from a basic bipolar transistor is provided. The modified transistor has an improved emitter structure comprising plural divided sub-emitter regions electrically isolated and spatially separated from each other. The plural divided sub-emitter regions may typically have a uniform emitter size identical with a basic emitter size of the basic bipolar transistor. A set of the plural divided sub-emitter regions provides an intended emitter current distinctly larger than the basic emitter current by a highly accurate direct current amplification factor corresponding to an intended emitter-size magnification factor.

4 Claims, 18 Drawing Sheets

Second horizontal direction

Second horizontal direction

Second horizontal direction

Second horizontal direction

Second horizontal direction

Second horizontal direction

Second horizontal direction

Second horizontal direction

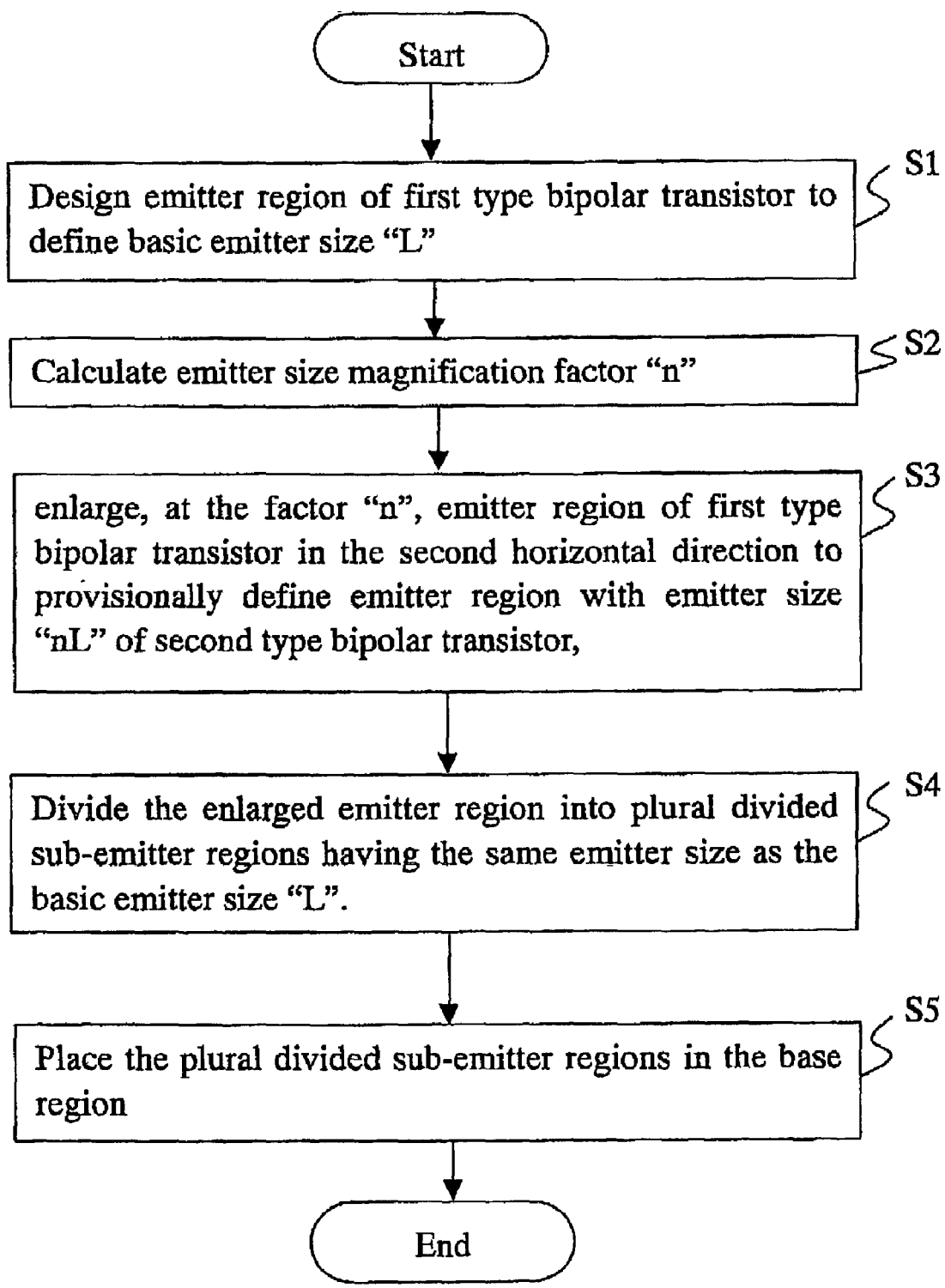

BIPOLAR TRANSISTOR WITH DIVIDED BASE AND EMITTER REGIONS

BACKGROUND OF THE INVENTION

1. Field of the Invention

The present invention relates to a semiconductor device and a method for design of the same, and more particularly to a semiconductor device including a bipolar transistor with an improved emitter region for a large emitter current output as well as a method for design of an emitter region of a bipolar transistor for a large emitter current output.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

A semiconductor device may include plural bipolar transistors which may be classified into different two types, for example, a first type bipolar transistor designed for a high speed performance with a low current output, and a second type bipolar transistor designed for a high current output.

In general, such first type bipolar transistors have a basic emitter size as a unit emitter size of an emitter region. The second type bipolar transistors may have one or more emitter sizes, which are larger than the basic emitter size of the first type bipolar transistors for providing larger current outputs than the first type bipolar transistors. The above larger emitter sizes allow the second type bipolar transistors to operate in wider direct current regions than the first type bipolar transistors.

In the present specification, the term "emitter size" is used and defined to be a size of the emitter region in a second horizontal direction perpendicular to a first direction along which the emitter region is distanced from a base electrode contact region. In some cases, the emitter regions have a rectangle shape in plan view having a longitudinal direction, which is parallel to the second horizontal direction, for which reason the second horizontal direction will, hereinafter, sometime, be referred to as a longitudinal direction.

The above-described second type bipolar transistors have generally been designed based on the above-described first type bipolar transistors, wherein the emitter size of the second type bipolar transistor is decided with reference to the basic emitter size of the first type bipolar transistor in consideration of an intended or required emitter current of the second type bipolar transistor with reference to a basic emitter current as an unit current defined by the basic emitter size of the first type bipolar transistor. On the other hand, the second type bipolar transistors have been designed to have one or more modified emitter sizes which are larger by an intended or desired direct magnification factor than the basic emitter size. A ratio of the modified emitter size of the second type bipolar transistor to the basic emitter size of the first type bipolar transistor will, hereinafter, be referred to as "magnification factor" or "emitter-size magnification factor". A ratio of the emitter current from the second type bipolar transistor to the basic emitter current from the first type bipolar transistor will, hereinafter, be referred to as "direct current amplification factor". In the design viewpoint, it is ideal or desirable that the direct current amplification factor would correspond to the magnification factor.

In conclusion, the above-described one or more modified emitter sizes of the second type bipolar transistors may be decided on the basis of the basic emitter size of the first type bipolar transistors. In view of the design process, the first type bipolar transistor may be considered as a basic bipolar transistor with the basic emitter size for output of the basic emitter current as a unit emitter current, while the above-described one or more second type bipolar transistors may be considered to be one or more modified bipolar transistors having one or more modified emitter sizes for outputs of one or more increased emitter currents which are larger than the basic emitter current. The following descriptions with reference to drawings of FIGS. 1A and 1B and FIGS. 2A and 2B will be concerned with typical conventional first type and second type bipolar transistors.

FIG. 1A is a fragmentary plan view illustrative of a conventional typical example of a second type bipolar transistor as a modified bipolar transistor in the prior art. FIG. 1B is a fragmentary cross sectional elevation view, taken along a C—C line shown in FIG. 1A. In these drawings, illustrations of various structures, which are irrelevant to the subject matter of the present invention, are omitted.

In FIGS. 1A and 1B, a bipolar transistor 100 corresponds to the above-described second type bipolar transistor which is designed for output of a larger emitter current. The second type bipolar transistor 100 has the following typical structure. An n+-type buried region 3 is selectively formed over part of a p-type semiconductor substrate 2. An n-type collector region 104 is also selectively formed over both part of the p-type semiconductor substrate 2 and entirety of the n+-type buried region 3. A p-type isolation region 5 is selectively formed over part of the p-type semiconductor substrate 2 to surround and define the n-type collector region 104 in a rectangle region in the plan view. A p-type base region 106 is selectively formed in an upper region of the n-type collector region 104 in a rectangle shape in the plan view. An n+-type emitter region 107 is also selectively formed in the p-type base region 106. A base electrode contact region 61 is also selectively formed in the p-type base region 106, wherein the base electrode contact region 61 is separated from the n+-type emitter region 107 by the p-type base region 106. A collector electrode contact region 41 is also selectively formed in the n-type collector region 104, so that the collector electrode contact region 41 is separated from the p-type base region 106 by the n-type collector region 104.

The n+-type emitter region 107 has a rectangle shape in plan view, which has a longitudinal direction represented by an arrow mark in FIG. 1A. An emitter size in the longitudinal direction of the n+-type emitter region 107 is 2L. The emitter current generally depends on this emitter size 2L. Increase in the emitter size of the n+-type emitter region 107 causes increase in the emitter current. Namely, the second type bipolar transistor 100 has the emitter size of 2L.

FIG. 2A is a fragmentary plan view illustrative of a conventional typical example of a first type bipolar transistor as a basic bipolar transistor in the prior art. FIG. 2B is a fragmentary cross sectional elevation view, taken along a D—D line shown in FIG. 2A. Similarly to FIGS. 1A and 1B, in these drawings, various structures, which are irrelevant to the subject matter of the present invention, are also omitted.

In FIGS. 2A and 2B, a bipolar transistor 200 corresponds to the above-described first type bipolar transistor which is designed for a high speed performance with a low current output. The first type bipolar transistor 200 is different from the above-described second type bipolar transistor 100 only in respective sizes of the emitter, base and collector regions as well as collector and base electrode contact regions in the second horizontal direction represented by an arrow mark.

The emitter size of the first type bipolar transistor 200 is "L" as illustrated in FIG. 2A, which is just one half of the above emitter size "2L" of the second type bipolar transistor 100 shown in FIG. 1A. Respective sizes in the second horizontal direction of the emitter, base and collector regions as well as collector and base electrode contact regions of the first type bipolar transistor 200 are half of the respective sizes of the emitter, base and collector regions as well as collector and base electrode contact regions in the second horizontal direction of the second type bipolar transistor 100.

As described above, in the design viewpoint, the first type bipolar transistor 200 is the basic bipolar transistor for allowing the second type bipolar transistor 100 to be deigned on the basis of or modified from the first type bipolar transistor 200 by a two times enlargement or magnification of the above respective sizes in the second horizontal direction, so that the increased emitter current defined by the modified or enlarged emitter size of the second type bipolar transistor 100 is larger by almost two times than the basic emitter current as a unit emitter current defined by the basic emitter size of the first type bipolar transistor 200.

In the above conventional typical example illustrated in FIGS. 1A and 1B, the magnification factor is only 2. The semiconductor device may, of course, include further modified bipolar transistors in addition to the above-described modified bipolar transistors. The further modified bipolar transistors may have one or more further modified or enlarged emitter sizes different from or larger than the above-described modified and enlarged emitter size, provided that the one or more further modified or enlarged emitter sizes are, of course, larger than the basic emitter size.

The above-described conventional design method would be efficient in designing a large number of various modified bipolar transistors with reference to the basic bipolar transistor. The conventional design method may, however, be effectively applicable as long as the intended or desired emitter-size magnification factor is relatively low. Namely, the conventional method may be inapplicable if the intended or desired emitter-size magnification factor is relatively high.

Increase in the intended or desired emitter-size magnification factor causes decrease in a direct current amplification factor "Hfe". Namely, if a high value of the magnification factor is intended or desired, then the direct current amplification factor "Hfe" may be dropped and does not correspond to the magnification factor. This undesired decrease in the direct current amplification factor "Hfe" would give rise to a deteriorated accuracy of or a certain decrease of the actually obtained emitter current as compared to the intended or desired emitter current from the second type bipolar transistor. In this case, the modified or enlarged bipolar transistors will exhibit an undesired output of emitter current lower than the intended or required value.

In order to avoid or eliminate the last-described problem or disadvantages, it may be suggested in design processes to make compensation to the influence by the drop of the direct current amplification factor "Hfe". This compensation is likely to be complicated and difficult, resulting in a remarkable increase in the load to the design work.

In the above circumstances, it is desired that the above-described one or more modified bipolar transistors with the improved emitter region would be free from any substantive drop of the direct current amplification factor "Hfe" upon taking large value of the emitter-size magnification factor. It is, therefore, desired to develop an improved emitter region of the modified bipolar transistors, wherein the improved emitter region is capable of preventing or suppressing any substantive drop of the direct current amplification factor "Hfe" upon taking large value of the emitter-size magnification factor. It is also desired to develop an improved design method for an emitter region of the modified bipolar transistor without any need to make compensation to the influence by the drop of the direct current amplification factor "Hfe" in the designed process.

The followings are the applicant's admitted prior arts which are believed to be informative to describe the state of the art that emitter regions are modified. Each emitter region is divided into plural sub-emitter regions which are aligned in a direction perpendicular to the second horizontal direction for the purpose of avoiding an undesirable concentration of the emitter current. These conventional techniques are, however, incapable of preventing or suppressing any substantive drop of the direct current amplification factor "Hfe" upon taking large value of the magnification factor.

Japanese laid-open patent publication No. 60-227471 discloses a semiconductor integrated circuit device including bipolar transistors, wherein plural emitter first electrode layers have common electrical connection through emitter first and second interconnection layers, while plural base first electrode layers have common electrical connection through a base first electrode layer. This conventional technique is to provide desired interconnection structures for connecting respective electrodes of the bipolar transistors. The interconnection structures are suitable for increasing the density of integration of the semiconductor integrated circuit as well as for preventing such a high current concentration as to cause an undesired secondary breakdown of a power transistor. This conventional technique is irrelevant to the above issue and is incapable of solving the above problem.

Japanese laid-open patent publication No. 61-194774 discloses a high frequency and high output bipolar transistor which includes base regions, emitter regions, base contact regions, emitter metal conductors, and base contact metal conductors, wherein a periphery length of a center-positioned emitter region is shorter than a periphery length of a side-positioned emitter region. This conventional technique is capable of preventing a thermal concentration at a center position of the transistor for allowing the transistor to exhibit a desired stability of operation. This conventional technique is also irrelevant to the above issue and is incapable of solving the above problem.

Japanese laid-open patent publication No. 2-5431 discloses a high frequency and high output semiconductor device, wherein a peripheral-positioned active device region positioned in a peripheral region of a pellet is lower in a total value of respective stabilized resistances than a center-positioned active device region positioned in a center region of the pellet. This conventional technique is to keep a desired uniformity of temperature increase over the respective active device regions for taking a desired thermal balance over positions. This conventional technique is also irrelevant to the above issue and is incapable of solving the above problem.

SUMMARY OF THE INVENTION

Accordingly, it is an object of the present invention to provide a novel emitter structure of a second type bipolar transistor modified from a first type basic transistor, wherein the second type bipolar transistor is free from the above problems.

It is a further object of the present invention to provide a novel semiconductor device including at least a first type basic bipolar transistor for providing a basic emitter current and at least a second type modified bipolar transistor for providing a distinctly larger emitter current than the basic emitter current, wherein the second type bipolar transistor is free from the above problems.

It is a still further object of the present invention to provide a novel method of designing an improved emitter structure of a second type bipolar transistor modified from a first type basic transistor, wherein the second type bipolar transistor is free from the above problems.

A primary aspect of the present invention provides a novel emitter structure of a modified bipolar transistor for a larger emitter current than a basic emitter current as a unit emitter current from a basic bipolar transistor. The novel emitter structure of the modified bipolar transistor comprises an emitter region which further comprises plural divided sub-emitter regions which are electrically isolated and spatially separated from each other. The plural divided sub-emitter regions are also electrically isolated and spatially separated from at least a base electrode contact region in a first horizontal direction. The plural divided sub-emitter regions have respective sub-emitter sizes defined in a second horizontal direction perpendicular to the first horizontal direction. The respective sub-emitter sizes may have either a uniformity or a limited variety, provided that a total sum of the respective sub-emitter sizes corresponds to a predetermined effective emitter size defined in the second horizontal direction for an intended emitter current from the emitter region.

Another primary of the present invention provides a novel semiconductor device. The semiconductor device includes: at least a first type bipolar transistor and at least a second type transistor. The first type bipolar transistor is the basic bipolar transistor for providing a basic emitter current as a unit emitter current, while the second type bipolar transistor is the modified bipolar transistor for providing a larger emitter current than the basic emitter current. The first type bipolar transistor further includes a first type collector region, a first type base region and a first type emitter region. The first type emitter region is distanced from a first type base electrode contact region in a first horizontal direction. The first type emitter region has a basic emitter size as a unit emitter size in a second horizontal direction perpendicular to the first horizontal direction. The second type bipolar transistor is modified from the first type bipolar transistor for enabling the second type bipolar transistor to provide a modified emitter current which is distinctly larger than the basic emitter current as the unit current. The second type bipolar transistor further includes a second type collector region, a second type base region and a second type emitter region. The second type emitter region is distanced from at least a second type base electrode contact region in the first horizontal direction. The second type emitter region has a modified emitter size in the second horizontal direction, wherein the modified emitter size is distinctly larger than the basic emitter size for providing a modified emitter current which is distinctly larger than the basic emitter current as the unit current. The second type emitter region further comprises plural divided sub-emitter regions electrically isolated and spatially separated from each other, and the plural divided sub-emitter regions having respective sub-emitter sizes defined in the second horizontal direction, and the respective sub-emitter sizes are within a range of 0.8 times to 1.2 times of the basic emitter size, and a total sum of the respective sub-emitter sizes corresponds to the modified emitter size.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 9 is a flow chart illustrative of a novel process for designing an improved emitter structure of a modified bipolar transistor from a basic bipolar transistor in accordance with the present invention.

DETAILED DESCRIPTION OF THE PREFERRED EMBODIMENTS

Figure 1A:
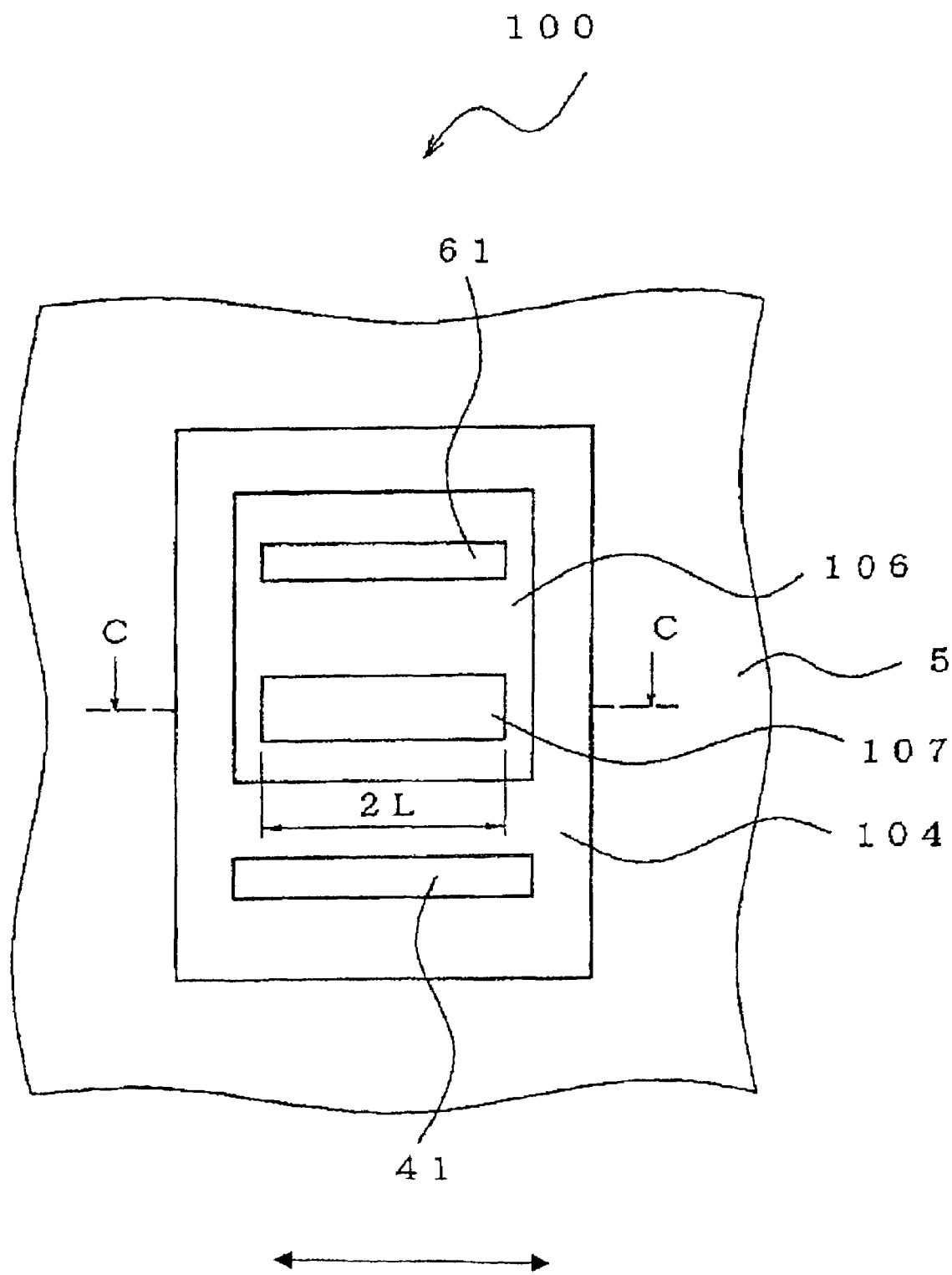
FIG. 1A is a fragmentary plan view of a typical conventional example of a second type modified basic bipolar transistor for providing a larger emitter current in the prior art.

A primary aspect of the present invention provides a novel emitter structure of a modified bipolar transistor for a larger emitter current than a basic emitter current as a unit emitter current from a basic bipolar transistor. The novel emitter structure of the modified bipolar transistor comprises an emitter region which further comprises plural divided sub-emitter regions which are electrically isolated and spatially separated from each other. The plural divided sub-emitter regions are also electrically isolated and spatially separated from at least a base electrode contact region in a first horizontal direction. The plural divided sub-emitter regions have respective sub-emitter sizes defined in a second horizontal direction perpendicular to the first horizontal direction. The respective sub-emitter sizes may have either a uniformity or a limited variety, provided that a total sum of the respective sub-emitter sizes corresponds to a predetermined effective emitter size defined in the second horizontal direction for an intended emitter current from the emitter region. In the present specification, the term "horizontal direction" does mean any direction included in a plane parallel to a surface of a semiconductor substrate over which a semiconductor device including bipolar transistors are provided.

A set of the above-described plural divided sub-emitter regions provides substantially the same emitter current as the intended emitter current which is distinctly larger than the basic emitter current without any remarkable variation in a direct current amplification factor "Hfe" upon taking any high value of the emitter-size magnification factor. Namely, the direct current amplification factor "Hfe" substantially corresponds to the emitter-size magnification factor even if the emitter-size magnification factor takes any high value.

Each of the respective sub-emitter sizes is distinctly smaller than the predetermined effective emitter size, but a total of the respective sub-emitter sizes is identical with the predetermined effective emitter size. Accordingly, as compared to a single continuous emitter region with a predetermined effective emitter size which is distinctly larger than the basic emitter size, each of the above plural divided sub-emitter regions with the respective sub-emitter sizes would be more similar to the basic emitter region with the basic emitter size in view of base-emitter junction conditions such as a junction area between the emitter and base regions and a junction section shape between them.

In the bipolar transistor, electrons and holes may serve as bipolar carriers to provide an emitter current. A current flowing through the base-emitter junction face is likely to depend on the base-emitter junction conditions. In the other words, a degree of prevention to the current flowing through the base-emitter junction face is likely to depend on the base-emitter junction conditions. The above-described similarity of each of the above plural divided sub-emitter regions to the basic emitter region in view of the base-emitter junction conditions would allow each of the above plural divided sub-emitter regions to have a desired similarity to the basic emitter region in view of the degree of prevention to the current flowing through the base-emitter junction face. Since the decrease in the direct current amplification factor "Hfe" is likely to depend on the degree of prevention to the current flowing through the base-emitter junction face, the above-described similarity would allow each of the above plural divided sub-emitter regions to have a desired similarity to the basic emitter region in view of the current flowing through the base-emitter junction face, namely in view of the emitter current.

As the similarity in view of the base-emitter junction conditions is high, the similarity in view of the current flowing through the base-emitter junction face or the emitter current is also high. Increase in the similarity in view of the base-emitter junction conditions by making the respective emitter sizes closer to the basic emitter size would give rise to decrease or suppress the degree of prevention of the current flowing through the base-emitter junction face or the emitter current. This decrease or suppression in the degree of prevention of the current would give rise to suppress drop or decrease in the direct current amplification factor, while the total sum of the respective emitter sizes of the plural divided sub-emitter regions corresponds to the intended emitter current, whereby a difference between an actual emitter current obtained from the set of the plural divided sub-emitter regions and the intended emitter current is decreased. This decrease in the difference ensures a high accuracy of the actual emitter current with reference to the intended emitter current.

Accordingly, the above described novel emitter structure allows the set of the plural divided sub-emitter regions to provide a high accuracy of the emitter current which is distinctly larger than the basic emitter current and also suppress or reduce the decrease in the direct current amplification factor "Hfe" of the emitter region.

Practically, it is preferable and advantageous that the respective sub-emitter sizes are limited within a range of 0.8 times to 1.2 times of the basic emitter size for ensuring a relatively high accuracy in the obtained emitter current with reference to the intended emitter current and for obtaining a desired significant reduction or suppression in the decrease in the direct current amplification factor "Hfe". More preferably, the respective sub-emitter sizes may be identical with the predetermined basic emitter size for allowing each of the plural divided sub-emitter regions to provide substantially the same current as the basic emitter current, whereby the set of the plural divided sub-emitter regions provides substantially the same emitter current as the intended emitter current with substantially no decrease in the direct current amplification factor "Hfe". The identity in view of the base-emitter junction conditions by making the respective emitter sizes identical with the basic emitter size would give rise to substantially no drop nor decrease in the direct current amplification factor, while the total sum of the respective emitter sizes of the plural divided sub-emitter regions is kept corresponding to the intended emitter current, resulting in substantially no difference between the actual emitter current obtained from the set of the plural divided sub-emitter regions and the intended emitter current, and also resulting in a highest accuracy of the actual emitter current with reference to the intended emitter current.

As described above, the plural divided sub-emitter regions are electrically isolated and spatially separated from each other. A distance between adjacent two of the plural divided sub-emitter regions may be optional, provided that such distance ensures the electrical isolation and the spatial separation, while minimization of the distance may be advantageous in view of a possible reduction in the necessary area for forming or providing the plural divided sub-emitter regions. The distance between adjacent two of the plural divided sub-emitter regions may be either constant or various, while the constant distance may often simplify the design of the emitter region. The number of the plural divided sub-emitter regions depends upon the intended emitter current or upon the intended emitter-size magnification factor with reference to the basic emitter current. The emitter-size magnification factor may take any number including, but not limited to, two or more natural numbers.

A variety of placements of the plural divided sub-emitter regions in the base region may be taken for the purpose of simply obtaining the intended emitter current without any significant decrease in the direct current amplification factor.

A first typical alignment is an alignment of the plural divided sub-emitter regions in the second horizontal direction, wherein the above at least one base electrode contact region may advantageously comprise plural base electrode contact sub-regions which are also aligned in the second horizontal direction and in parallel to the above second-directional alignment of the plural divided sub-emitter regions, so that the plural divided sub-emitter regions have a uniform distance from the plural base electrode contact sub-regions over the second horizontal direction. Namely, the distance between the emitter region and the base electrode contact region remains unchanged over the second horizontal direction. Increase in the distance between the emitter region and the base electrode contact region gives rise to increase in a parasitic resistance between the emitter and base regions. This increase in the parasitic resistance between the emitter and base regions is disadvantageous particularly for a desired high speed performance with a large emitter current in a high frequency range. Further, the increase in another size of the emitter region in the first direction also causes an undesired increase in the parasitic resistance between the emitter and base regions. Accordingly, for ensuring a desired low parasitic resistance between the emitter and base regions, it is preferable that the plural divided sub-emitter regions are aligned in the second horizontal direction, while the plural base electrode contact sub-regions are also aligned in the second horizontal direction and in parallel to the above second-directional alignment of the plural divided sub-emitter regions, to keep an optimum and uniform distance between the plural divided sub-emitter regions and the plural base electrode contact sub-regions, and to ensure a desired low parasitic resistance advantageous particularly for desired high speed performance in the high frequency range.

As described above, since the above described set of the plural divided sub-emitter regions is in the form of a single emitter region of the single bipolar transistor, the plural divided sub-emitter regions are, of course, provided in the base region of the bipolar transistor. The base region may have a variety of structure, including a single continuous base region or a discontinuous base region. A first typical example of the base region is a single continuous base region in a single continuous collector region surrounded by an isolation region. In this case, respective parallel alignments in the second horizontal direction of the plural divided sub-emitter regions and the plural base electrode contact sub-regions are provided within the single continuous base region.

A second typical example of the base region is a discontinuous base region in a single continuous collector region surrounded by an isolation region, wherein the discontinuous base region comprises plural divided sub-base regions electrically isolated and spatially separated from each other. In one typical example, the plural divided sub-base regions may be aligned in the second horizontal direction, wherein each pair of the plural base electrode contact sub-regions and the plural divided sub-emitter regions is provided in each of the plural divided sub-base regions. A distance between adjacent two of the plural divided sub-base regions should be decided to ensure an electrical isolation between them, while it is preferable to minimize the distance for a possible reduction in the necessary area for forming or providing the plural divided sub-base regions in the collector region.

A second typical alignment is another alignment of the plural divided sub-emitter regions in the first horizontal direction, wherein the at least one base electrode contact region and the plural divided sub-emitter regions are aligned in the first horizontal direction to form a single first directional alignment. In this single first directional alignment, one base electrode contact region and one of the plural divided sub-emitter regions may preferably be adjacent to each other but electrically isolated and spatially separated from each other at a uniform distance in the first horizontal direction. As described above, the parasitic resistance between the emitter and base regions depends on the distance between the at least one base electrode contact region and the plural divided sub-emitter regions. Further, as described above, it is preferable to keep a low parasitic resistance between the emitter and base regions particularly for high speed performance in the high frequency range. For these purposes, it is preferable that respective distances between the base electrode contact region and the divided sub-emitter region are uniform and kept constant. Further, the distance between the base electrode contact region and the divided sub-emitter region should be decided by taking into account of a desired reduction in the parasitic resistance between the emitter and base regions.

As also described above, since the above described set of the plural divided sub-emitter regions is in the form of a single emitter region of the single bipolar transistor, the plural divided sub-emitter regions are, of course, provided in the base region of the bipolar transistor. The base region may have a variety of structure, including a single continuous base region or a discontinuous base region. In a first typical example, the plural divided sub-emitter regions may be provided in a continuous base region in a single continuous collector region surrounded by an isolation region. In a second typical example, the above-described single first directional alignment may include at least a set of one base electrode contact region and two divided sub-emitter regions, wherein the one base electrode contact region is interposed between the two divided sub-emitter regions, and the one base electrode contact region is electrically isolated and spatially separated from the two divided sub-emitter regions. The respective distances between the one base electrode contact region and the two divided sub-emitter regions are preferably the same as each other, and this distance should preferably be decided in consideration of the parasitic resistance in the above-described viewpoint. In accordance with this typical example, only one base electrode contact region is necessary for the two divided sub-emitter regions with keeping the constant or uniform respective distances between the base electrode contact region and the divided sub-emitter region. For this reason, this example of arrangement may be advantageous in view of obtaining a possible reduction in the necessary area for forming or providing the divided sub-emitter regions and the base electrode contact region.

A third typical alignment is another alignment of the plural divided sub-emitter regions in the matrix. This matrix may have a variety of matrix type. In one typical example of the matrix, plural first directional alignments, each of which extends in the first horizontal direction, are aligned in the second horizontal direction to form the matrix, wherein each of the plural first directional alignments further includes the at least one base electrode contact region and the plural divided sub-emitter regions. In each of the plural first directional alignments, one base electrode contact region and one of the plural divided sub-emitter regions are adjacent to each other but electrically isolated and spatially separated from each other at a uniform distance. As described above, the parasitic resistance between the emitter and base regions depends on the distance between the at least one base electrode contact region and the plural divided sub-emitter regions. Further, as described above, it is preferable to keep a low parasitic resistance between the emitter and base regions particularly for high speed performance in the high frequency range. For these purposes, it is preferable that respective distances between the base electrode contact region and the divided sub-emitter region are uniform and kept constant. Further, the distance between the base electrode contact region and the divided sub-emitter region should be decided by taking into account of a desired reduction in the parasitic resistance between the emitter and base regions.

As also described above, since the above described set of the plural divided sub-emitter regions is in the matrix form of a single emitter region of the single bipolar transistor, the plural divided sub-emitter regions are, of course, provided in the base region of the bipolar transistor. The base region may have a variety of structure, including a single continuous base region or a discontinuous base region. In a first typical example, the plural divided sub-emitter regions may be provided in a continuous base region in a single continuous collector region surrounded by an isolation region. In a second typical example, the plural sets are provided in a discontinuous base region in a single continuous collector region surrounded by an isolation region. In one typical example, the discontinuous base region may comprise plural divided sub-base regions electrically isolated and spatially separated from each other in the second horizontal direction, wherein the plural divided sub-base regions are aligned in the second horizontal direction, and each of the above plural sets is provided in each of the plural divided sub-base regions. In one typical example, each of the above plural sets provided in each of the plural divided sub-base regions may comprise a set of one base electrode contact region and two divided sub-emitter regions, wherein the one base electrode contact region is interposed between the two divided sub-emitter regions, and the one base electrode contact region is electrically isolated and spatially separated from the two divided sub-emitter regions. The respective distances between the one base electrode contact region and the two divided sub-emitter regions are preferably the same as each other, and this distance should preferably be decided in consideration of the parasitic resistance in the above-described viewpoint. In accordance with this typical example, only one base electrode contact region is necessary for every two of the divided sub-emitter regions with keeping the constant or uniform respective distances between the base electrode contact region and the divided sub-emitter region. For this reason, this example of arrangement may be advantageous in view of obtaining a possible reduction in the necessary area for forming or providing the divided sub-emitter regions and the base electrode contact region.

Another aspect of the present invention provides a novel semiconductor device. The semiconductor device includes: at least a first type bipolar transistor and at least a second type bipolar transistor. The first type bipolar transistor is the basic bipolar transistor for providing a basic emitter current as a unit emitter current, while the second type bipolar transistor is the modified bipolar transistor for providing a larger emitter current than the basic emitter current. The first type bipolar transistor further includes a first type collector region, a first type base region and a first type emitter region. The first type emitter region is distanced from a first type base electrode contact region in a first horizontal direction. The first type emitter region has a basic emitter size as a unit emitter size in a second horizontal direction perpendicular to the first horizontal direction.

The second type bipolar transistor is modified from the first type bipolar transistor for enabling the second type bipolar transistor to provide a modified emitter current which is distinctly larger than the basic emitter current as the unit current. The second type bipolar transistor further includes a second type collector region, a second type base region and a second type emitter region. The second type emitter region is distanced from at least a second type base electrode contact region in the first horizontal direction. The second type emitter region has a modified emitter size in the second horizontal direction, wherein the modified emitter size is distinctly larger than the basic emitter size for providing a modified emitter current which is distinctly larger than the basic emitter current as the unit current.

The second type emitter region further comprises plural divided sub-emitter regions electrically isolated and spatially separated from each other, and the plural divided sub-emitter regions having respective sub-emitter sizes defined in the second horizontal direction, and the respective sub-emitter sizes are within a range of 0.8 times to 1.2 times of the basic emitter size, and a total sum of the respective sub-emitter sizes corresponds to the modified emitter size.

Since the subject matter of the present invention relates to the second type bipolar transistor modified from the first type bipolar transistor, in the following descriptions, no indication of the first or second type will represent the second type. For example, the bipolar transistor represents the second type bipolar transistor. The emitter region represents the second type emitter region of the second type bipolar transistor. The base region also represents the second type base region of the second type bipolar transistor. The collector region also represents the second type collector region of the second type bipolar transistor.

A set of the above-described plural divided sub-emitter regions provides substantially the same emitter current as the intended emitter current which is distinctly larger than the basic emitter current without any remarkable variation in a direct current amplification factor "Hfe" upon taking any high value of the emitter-size magnification factor. Each of the respective sub-emitter sizes is distinctly smaller than the predetermined effective emitter size, but a total of the respective sub-emitter sizes is identical with the predetermined effective emitter size. Accordingly, as compared to a single continuous emitter region with a predetermined effective emitter size which is distinctly larger than the basic emitter size of the first type emitter region of the first type bipolar transistor, each of the above plural divided sub-emitter regions with the respective sub-emitter sizes would be more similar to the basic emitter region with the basic emitter size in view of base-emitter junction conditions such as a junction area between the emitter and base regions and a junction section shape between them.

As described above, the current flowing through the base-emitter junction face is likely to depend on the base-emitter junction conditions. In the other words, the degree of prevention to the current flowing through the base-emitter junction face is likely to depend on the base-emitter junction conditions. The above-described similarity of each of the above plural divided sub-emitter regions to the basic emitter region in view of the base-emitter junction conditions would allow that each of the above plural divided sub-emitter regions of the modified bipolar transistor has a desired similarity to the basic emitter region of the basic bipolar transistor in view of the degree of prevention to the current flowing through the base-emitter junction face. The dependency of the decrease in the direct current amplification factor "Hfe" upon degree of prevention to the current flowing through the base-emitter junction face would allow that each of the above plural divided sub-emitter regions of the modified bipolar transistor has a desired similarity to the basic emitter region of the basic bipolar transistor in view of the current flowing through the base-emitter junction face, namely in view of the emitter current.

Increase in the similarity in view of the base-emitter junction conditions by making the respective emitter sizes closer to the basic emitter size would give rise to decrease or suppress the degree of prevention of the current flowing through the base-emitter junction face or the emitter current, thereby to suppress drop or decrease in the direct current amplification factor, while allowing that the total sum of the respective emitter sizes of the plural divided sub-emitter regions corresponds to the intended emitter current, resulting in a high accuracy of the actual emitter current with reference to the intended emitter current.

Accordingly, the above described novel emitter structure allows the set of the plural divided sub-emitter regions to provide a high accuracy of the emitter current which is distinctly larger than the basic emitter current and also suppress or reduce the decrease in the direct current amplification factor "Hfe" of the emitter region.

As described above, it is advantageous that the respective sub-emitter sizes are limited within a range of 0.8 times to 1.2 times of the basic emitter size for ensuring a relatively high accuracy in the obtained emitter current with reference to the intended emitter current and for obtaining a desired significant reduction or suppression in the decrease in the direct current amplification factor "Hfe". More preferably, the respective sub-emitter sizes are identical with the predetermined basic emitter size for allowing each of the plural divided sub-emitter regions to provide substantially the same current as the basic emitter current, whereby the set of the plural divided sub-emitter regions provides substantially the same emitter current as the intended emitter current with substantially no decrease in the direct current amplification factor "Hfe". The identity in view of the base-emitter junction conditions by making the respective emitter sizes identical with the basic emitter size would give rise to substantially no drop nor decrease in the direct current amplification factor, while the total sum of the respective emitter sizes of the plural divided sub-emitter regions is kept corresponding to the intended emitter current, resulting in substantially no difference between the actual emitter current obtained from the set of the plural divided sub-emitter regions and the intended emitter current, and also resulting in a highest accuracy of the actual emitter current with reference to the intended emitter current.

As described above, a distance between adjacent two of the plural divided sub-emitter regions may be optional, provided that such distance ensures the electrical isolation and the spatial separation, while minimization of the distance may be advantageous in view of a possible reduction in the necessary area for forming or providing the plural divided sub-emitter regions.

A variety of placements of the plural divided sub-emitter regions in the base region may be taken for the purpose of simply obtaining the intended emitter current with significantly reduced decrease in the direct current amplification factor.

A first typical alignment is an alignment of the plural divided sub-emitter regions in the second horizontal direction, wherein the above at least one base electrode contact region may advantageously comprise plural base electrode contact sub-regions which are also aligned in the second horizontal direction and in parallel to the above second-directional alignment of the plural divided sub-emitter regions, so that the plural divided sub-emitter regions have a uniform distance from the plural base electrode contact sub-regions over the second horizontal direction. The detailed descriptions in connection with this first typical alignment are duplicate to the above descriptions in the first aspect of the present invention. Duplicate descriptions will thus be omitted.

As described above, since the above described set of the plural divided sub-emitter regions is in the form of a single emitter region of the single bipolar transistor, the plural divided sub-emitter regions are, of course, provided in the base region of the bipolar transistor. The base region may have a variety of structure, including a single continuous base region or a discontinuous base region.

A first typical example of the base region is a single continuous base region in a single continuous collector region surrounded by an isolation region. In this case, respective parallel alignments in the second horizontal direction of the plural divided sub-emitter regions and the plural base electrode contact sub-regions are provided within the single continuous base region.

A second typical example of the base region is a discontinuous base region in a single continuous collector region surrounded by an isolation region, wherein the discontinuous base region comprises plural divided sub-base regions electrically isolated and spatially separated from each other. In one typical example, the plural divided sub-base regions may be aligned in the second horizontal direction, wherein each pair of the plural base electrode contact sub-regions and the plural divided sub-emitter regions is provided in each of the plural divided sub-base regions. A distance between adjacent two of the plural divided sub-base regions should be decided to ensure an electrical isolation between them, while it is preferable to minimize the distance for a possible reduction in the necessary area for forming or providing the plural divided sub-base regions in the collector region.

A second typical alignment is another alignment of the plural divided sub-emitter regions in the first horizontal direction, wherein the at least one base electrode contact region and the plural divided sub-emitter regions are aligned in the first horizontal direction to form a single first directional alignment. In this single first directional alignment, one base electrode contact region and one of the plural divided sub-emitter regions may preferably be adjacent to each other but electrically isolated and spatially separated from each other at a uniform distance in the first horizontal direction. The detailed descriptions in connection with this second typical alignment are duplicate to the above descriptions in the first aspect of the present invention. Duplicate descriptions will thus be omitted.

As also described above, since the above described set of the plural divided sub-emitter regions is in the form of a single emitter region of the single bipolar transistor, the plural divided sub-emitter regions are, of course, provided in the base region of the bipolar transistor. The base region may have a variety of structure, including a single continuous base region or a discontinuous base region. In a first typical example, the plural divided sub-emitter regions may be provided in a continuous base region in a single continuous collector region surrounded by an isolation region. In a second typical example, the above-described single first directional alignment may include at least a set of one base electrode contact region and two of the plural divided sub-emitter regions, wherein the one base electrode contact region may preferably be interposed between the two divided sub-emitter regions. The one base electrode contact region is electrically isolated and spatially separated from the two divided sub-emitter regions.

A third typical alignment is another alignment of the plural divided sub-emitter regions in the matrix. This matrix may have a variety of matrix type. In one typical example of the matrix, plural first directional alignments, each of which extends in the first horizontal direction, are aligned in the second horizontal direction to form the matrix, wherein each of the plural first directional alignments further includes the at least one base electrode contact region and the plural divided sub-emitter regions, and in each of the plural first directional alignments, one base electrode contact region and one of the plural divided sub-emitter regions are adjacent to each other but electrically isolated and spatially separated from each other at a uniform distance. The detailed descriptions in connection with this third typical alignment are duplicate to the above descriptions in the first aspect of the present invention. Duplicate descriptions will thus be omitted.

As also described above, since the above described set of the plural divided sub-emitter regions is in the matrix form of a single emitter region of the single bipolar transistor, the plural divided sub-emitter regions are, of course, provided in the base region of the bipolar transistor. The base region may have a variety of structure, including a single continuous base region or a discontinuous base region. In a first typical example, the plural divided sub-emitter regions may be provided in a continuous base region in a single continuous collector region surrounded by an isolation region. In a second typical example, the plural sets are provided in a discontinuous base region in a single continuous collector region surrounded by an isolation region. In one typical example, the discontinuous base region may comprise plural divided sub-base regions electrically isolated and spatially separated from each other in the second horizontal direction, wherein the plural divided sub-base regions are aligned in the second horizontal direction, and each of the above plural sets is provided in each of the plural divided sub-base regions. In one typical example, each of the above plural sets provided in each of the plural divided sub-base regions may comprise a set of one base electrode contact region and two divided sub-emitter regions, wherein the one base electrode contact region is interposed between the two divided sub-emitter regions, and the one base electrode contact region is electrically isolated and spatially separated from the two divided sub-emitter regions.

Still another aspect of the present invention is to provide a semiconductor device. The semiconductor device includes at least a first type bipolar transistor and at least a second type transistor. The first type bipolar transistor is the basic bipolar transistor for providing a basic emitter current as a unit emitter current, while the second type bipolar transistor is the modified bipolar transistor for providing a larger emitter current than the basic emitter current. The first type bipolar transistor further includes a first type collector region, a first type base region and a first type emitter region. The first type emitter region is distanced from a first type base electrode contact region in a first horizontal direction. The first type emitter region has a basic emitter size as a unit emitter size in a second horizontal direction perpendicular to the first horizontal direction.

The second type bipolar transistor is modified from the first type bipolar transistor for enabling the second type bipolar transistor to provide a modified emitter current which is distinctly larger than the basic emitter current as the unit current. The second type bipolar transistor further includes a second type collector region, a second type base region and a second type emitter region. The second type emitter region is distanced from at least a second type base electrode contact region in the first horizontal direction. The second type emitter region has a modified emitter size in the second horizontal direction, wherein the modified emitter size is distinctly larger than the basic emitter size for providing a modified emitter current which is distinctly larger than the basic emitter current as the unit current.

The second type emitter region further comprises plural divided sub-emitter regions electrically isolated and spatially separated from each other. The plural divided sub-emitter regions are aligned in the second horizontal direction. The at least one base electrode contact region comprises plural base electrode contact sub-regions which are aligned in the second horizontal direction and in parallel to the second-directional alignment of the plural divided sub-emitter regions. The plural divided sub-emitter regions have a uniform distance from the plural base electrode contact sub-regions over the second horizontal direction.

The plural divided sub-emitter regions may have preferably respective sub-emitter sizes defined in the second horizontal direction, wherein the respective sub-emitter sizes are within a range of 0.8 times to 1.2 times of the basic emitter size, and a total sum of the respective sub-emitter sizes corresponds to the modified emitter size. More preferably, the respective sub-emitter sizes may be identical with the predetermined basic emitter size.

The second type base region may take a variety of structure. For example, the second type base region may comprise a continuous base region in a single continuous collector region surrounded by an isolation region, and the plural divided sub-emitter regions are provided in the continuous base region. Alternatively, the second type base region may also comprise a discontinuous base region in a single continuous collector region surrounded by an isolation region, wherein the discontinuous base region may comprise plural divided sub-base regions electrically isolated and spatially separated from each other. The plural divided sub-base regions may be aligned in the second horizontal direction. Each pair of the plural base electrode contact sub-regions and the plural divided sub-emitter regions may be provided in each of the plural divided sub-base regions.

Yet another aspect of the present invention is to provide a semiconductor device. The semiconductor device includes: at least a first type bipolar transistor and at least a second type transistor. The first type bipolar transistor is the basic bipolar transistor for providing a basic emitter current as a unit emitter current, while the second type bipolar transistor is the modified bipolar transistor for providing a larger emitter current than the basic emitter current. The first type bipolar transistor further includes a first type collector region, a first type base region and a first type emitter region. The first type emitter region is distanced from a first type base electrode contact region in a first horizontal direction.

The first type emitter region has a basic emitter size as a unit emitter size in a second horizontal direction perpendicular to the first horizontal direction.

The second type bipolar transistor is modified from the first type bipolar transistor for enabling the second type bipolar transistor to provide a modified emitter current which is distinctly larger than the basic emitter current as the unit current. The second type bipolar transistor further includes a second type collector region, a second type base region and a second type emitter region. The second type emitter region is distanced from at least a second type base electrode contact region in the first horizontal direction. The second type emitter region has a modified emitter size in the second horizontal direction, wherein the modified emitter size is distinctly larger than the basic emitter size for providing a modified emitter current which is distinctly larger than the basic emitter current as the unit current.

The second type emitter region may further comprise plural divided sub-emitter regions electrically isolated and spatially separated from each other. The plural divided sub-emitter regions are aligned in the first horizontal direction. The at least one base electrode contact region and the plural divided sub-emitter regions are aligned in the first horizontal direction to form a single first directional alignment, in which one base electrode contact region and one of the plural divided sub-emitter regions are adjacent to each other but electrically isolated and spatially separated from each other at a uniform distance.

The plural divided sub-emitter regions may have respective sub-emitter sizes defined in the second horizontal direction, wherein the respective sub-emitter sizes may preferably be within a range of 0.8 times to 1.2 times of the basic emitter size, but a total sum of the respective sub-emitter sizes corresponds to the modified emitter size. More preferably, the respective sub-emitter sizes may be identical with the predetermined basic emitter size. The second base region may take a variety of structure. For example, the second base region may comprise a continuous base region in a single continuous collector region surrounded by an isolation region, and the plural divided sub-emitter regions are provided in the continuous base region.

In one typical example, the first directional alignment may include at least a set of one base electrode contact region and two divided sub-emitter regions, wherein the one base electrode contact region may preferably be interposed between the two divided sub-emitter regions, and the one base electrode contact region is electrically isolated and spatially separated from the two divided sub-emitter regions.

Further aspect of the present invention is to a semiconductor device. The semiconductor device includes: at least a first type bipolar transistor and at least a second type transistor. The first type bipolar transistor is the basic bipolar transistor for providing a basic emitter current as a unit emitter current, while the second type bipolar transistor is the modified bipolar transistor for providing a larger emitter current than the basic emitter current. The first type bipolar transistor further includes a first type collector region, a first type base region and a first type emitter region. The first type emitter region is distanced from a first type base electrode contact region in a first horizontal direction. The first type emitter region has a basic emitter size as a unit emitter size in a second horizontal direction perpendicular to the first horizontal direction.

The second type bipolar transistor is modified from the first type bipolar transistor for enabling the second type bipolar transistor to provide a modified emitter current which is distinctly larger than the basic emitter current as the unit current. The second type bipolar transistor further includes a second type collector region, a second type base region and a second type emitter region. The second type emitter region is distanced from at least a second type base electrode contact region in the first horizontal direction. The second type emitter region has a modified emitter size in the second horizontal direction, wherein the modified emitter size is distinctly larger than the basic emitter size for providing a modified emitter current which is distinctly larger than the basic emitter current as the unit current.

The second type emitter region further comprises plural divided sub-emitter regions electrically isolated and spatially separated from each other. The plural divided sub-emitter regions are aligned in a matrix. In this matrix, plural first directional alignments, each of which extends in the first horizontal direction, are aligned in the second horizontal direction, wherein each of the plural first directional alignments may further include the at least one base electrode contact region and the plural divided sub-emitter regions. In each of the plural first directional alignments, one base electrode contact region and one of the plural divided sub-emitter regions may preferably be adjacent to each other but electrically isolated and spatially separated from each other at a uniform distance.

The plural divided sub-emitter regions may have respective sub-emitter sizes defined in the second horizontal direction, wherein the respective sub-emitter sizes may preferably be within a range of 0.8 times to 1.2 times of the basic emitter size, but a total sum of the respective sub-emitter sizes corresponds to the modified emitter size. More preferably, the respective sub-emitter sizes may be identical with the predetermined basic emitter size.

The second type base region may take a variety of structure. The second type base region may comprise a continuous base region in a single continuous collector region surrounded by an isolation region. The plural sets may be provided in the continuous base region. Alternatively, the second type base legion may comprise a discontinuous base region in a single continuous collector region surrounded by an isolation region. The discontinuous base region may comprise plural divided sub-base regions electrically isolated and spatially separated from each other in the second horizontal direction. The plural divided sub-base regions may be aligned in the second horizontal direction, wherein each of the plural sets may preferably be provided in each of the plural divided sub-base regions.

An additional aspect of the present invention is to provide a process for designing a second type bipolar transistor as a modified bipolar transistor based on a first type bipolar transistor as a basic bipolar transistor, wherein the subject mater of the present invention is to design the second type emitter region as the modified emitter region of the second type bipolar transistor on the basis of the first type emitter region as the basic emitter region of the first type bipolar transistor. The process may include the following steps. A first type emitter region of the first type bipolar transistor is designed, wherein the first type emitter region has a basic emitter size as a unit emitter size for a basic emitter current as a unit emitter current. In the present descriptions, the basic emitter size is hereby defined as an emitter size in a second horizontal direction perpendicular to a first horizontal direction along which the first type emitter region is spatially separated from a base electrode contact region.

Namely, the first and second horizontal directions are the same as described above in the foregoing descriptions.

Further, an emitter-size magnification factor is calculated.

Furthermore, a second type emitter region of the second type bipolar transistor is provisionally defined by enlarging, at the calculated emitter-size magnification factor, the first type emitter region of the first type bipolar transistor in the second horizontal direction, so that the second type emitter region has a modified emitter size which is larger by the calculated emitter-size magnification factor than the basic emitter size.

Then, the enlarged second type emitter region is divided into plural divided sub-emitter regions.

Finally, the plural divided sub-emitter regions are placed or arranged in the base region.

The placement may advantageously align the plural divided sub-emitter regions either in the second horizontal direction, or in the first horizontal direction, or in matrix.

The division may preferably be executed to set respective sub-emitter sizes of the plural divided sub-emitter regions within a range of 0.8 times to 1.2 times of the basic emitter size, but a total sum of the respective sub-emitter sizes corresponds to the modified emitter size. More preferably, the respective sub-emitter sizes may be identical with the predetermined basic emitter size.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

PREFERRED EMBODIMENTS

Figure 1B:
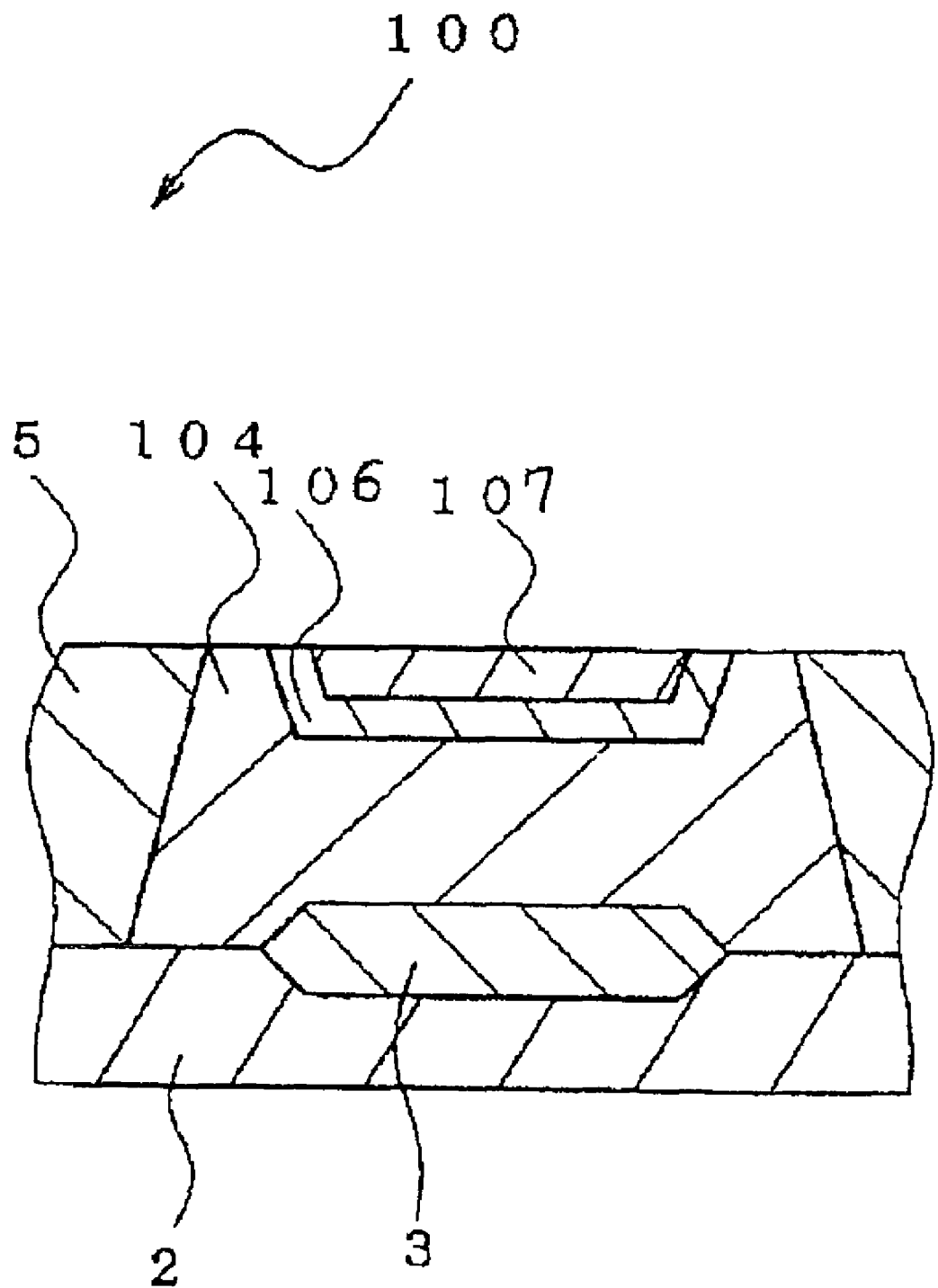
FIG. 1B is a fragmentary cross sectional elevation view, taken along a C—C line of FIG. 1A.
Figure 2A:
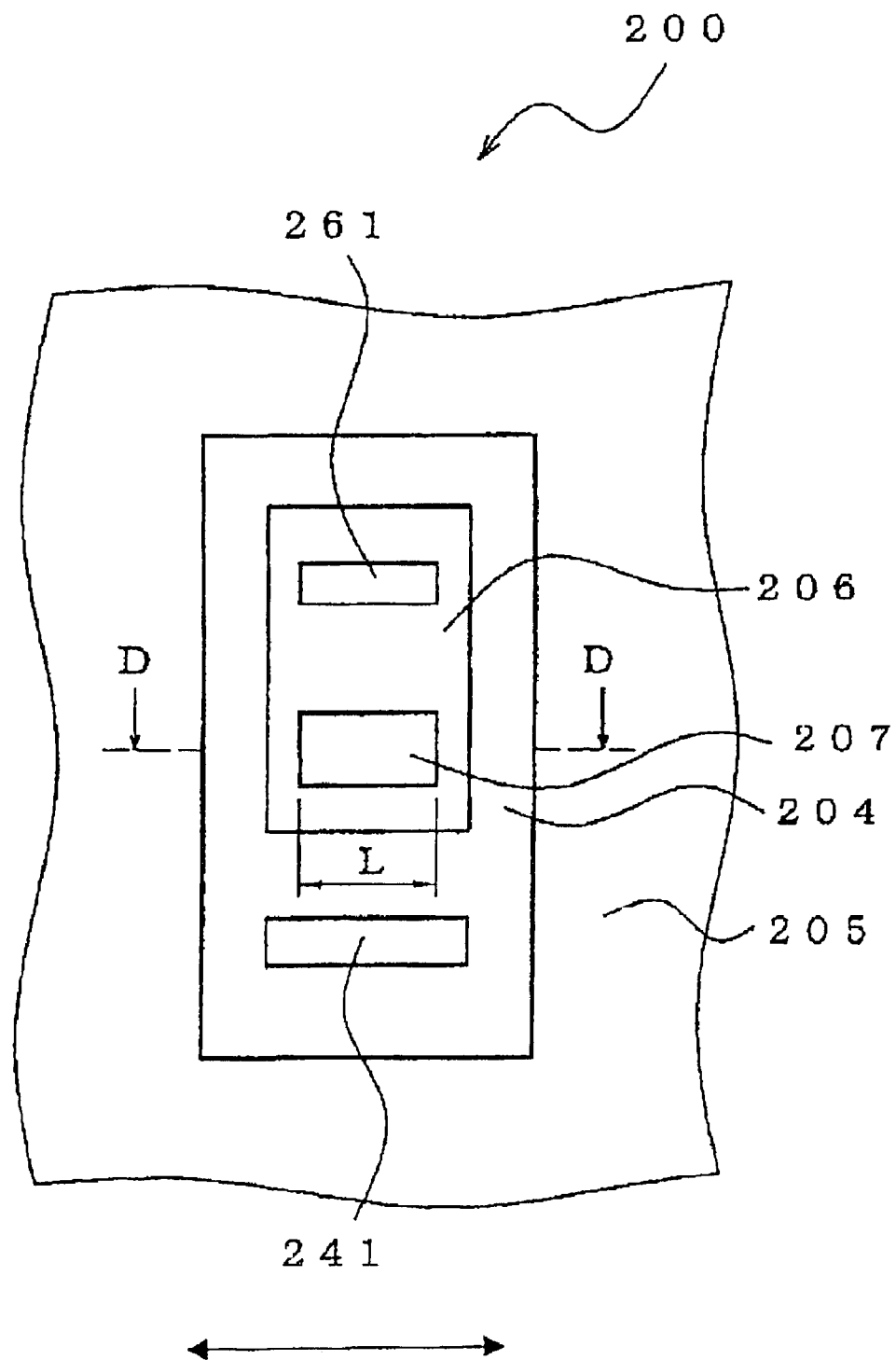
FIG. 2A is a fragmentary plan view of a typical conventional example of a first type basic bipolar transistor for providing a basic emitter current in the prior art.
Figure 2B:
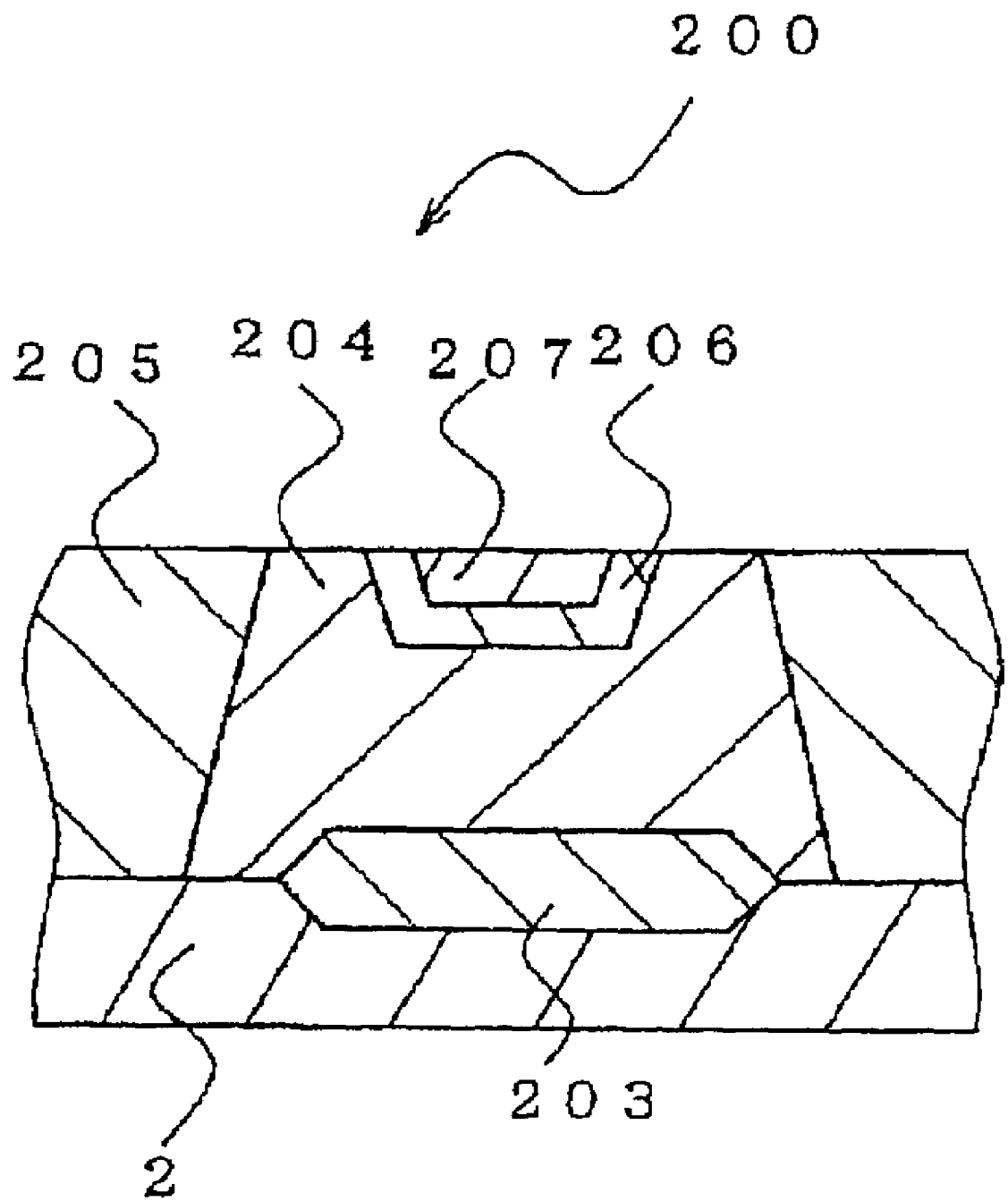
FIG. 2B is a fragmentary cross sectional elevation view, taken along a D—D line of FIG. 2A.
Figure 3A:
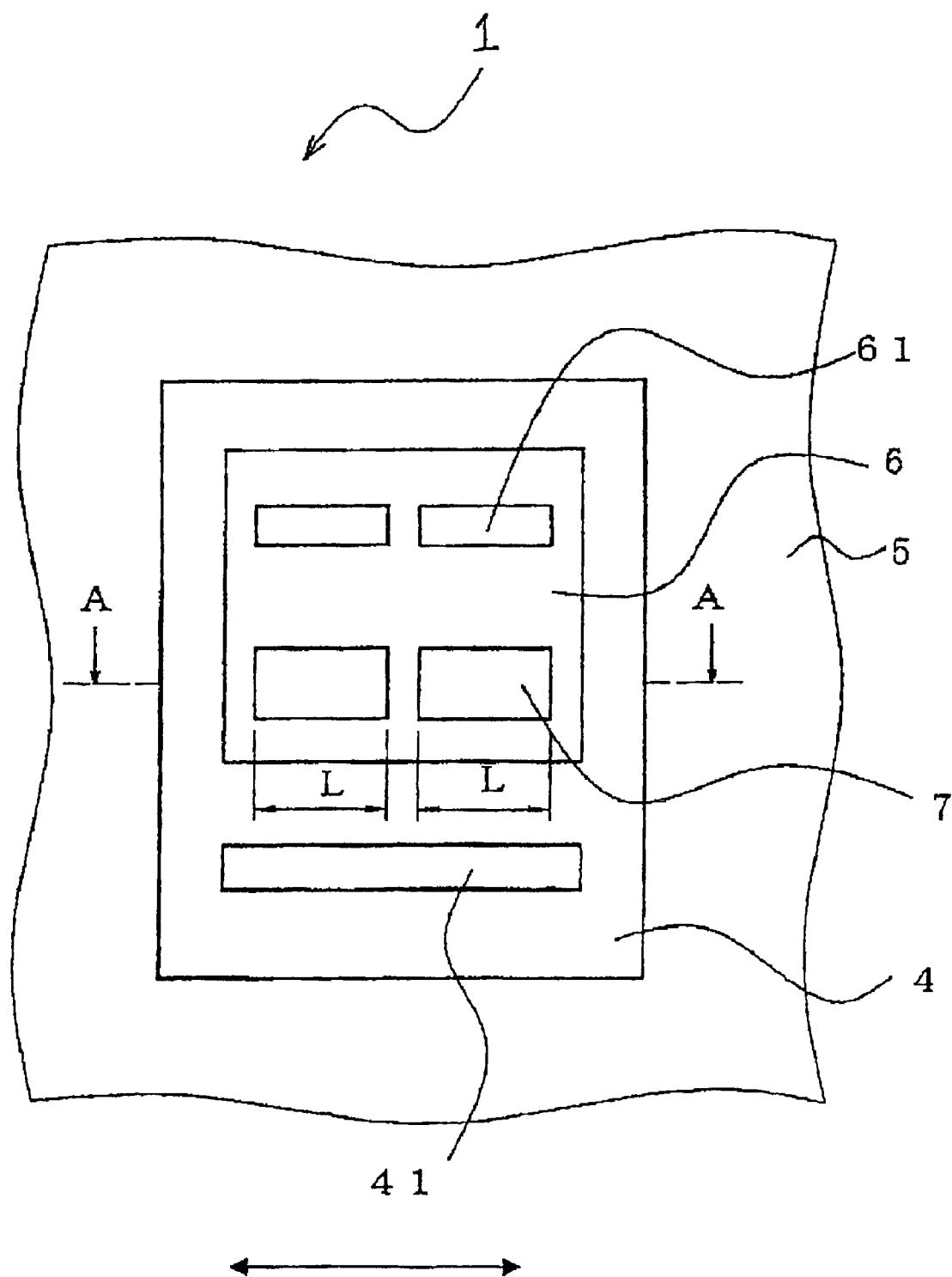
FIG. 3A is a fragmentary plan view of a typical preferred example of a second type bipolar transistor modified from a first type basic bipolar transistor in accordance with the present invention.
Figure 3B:
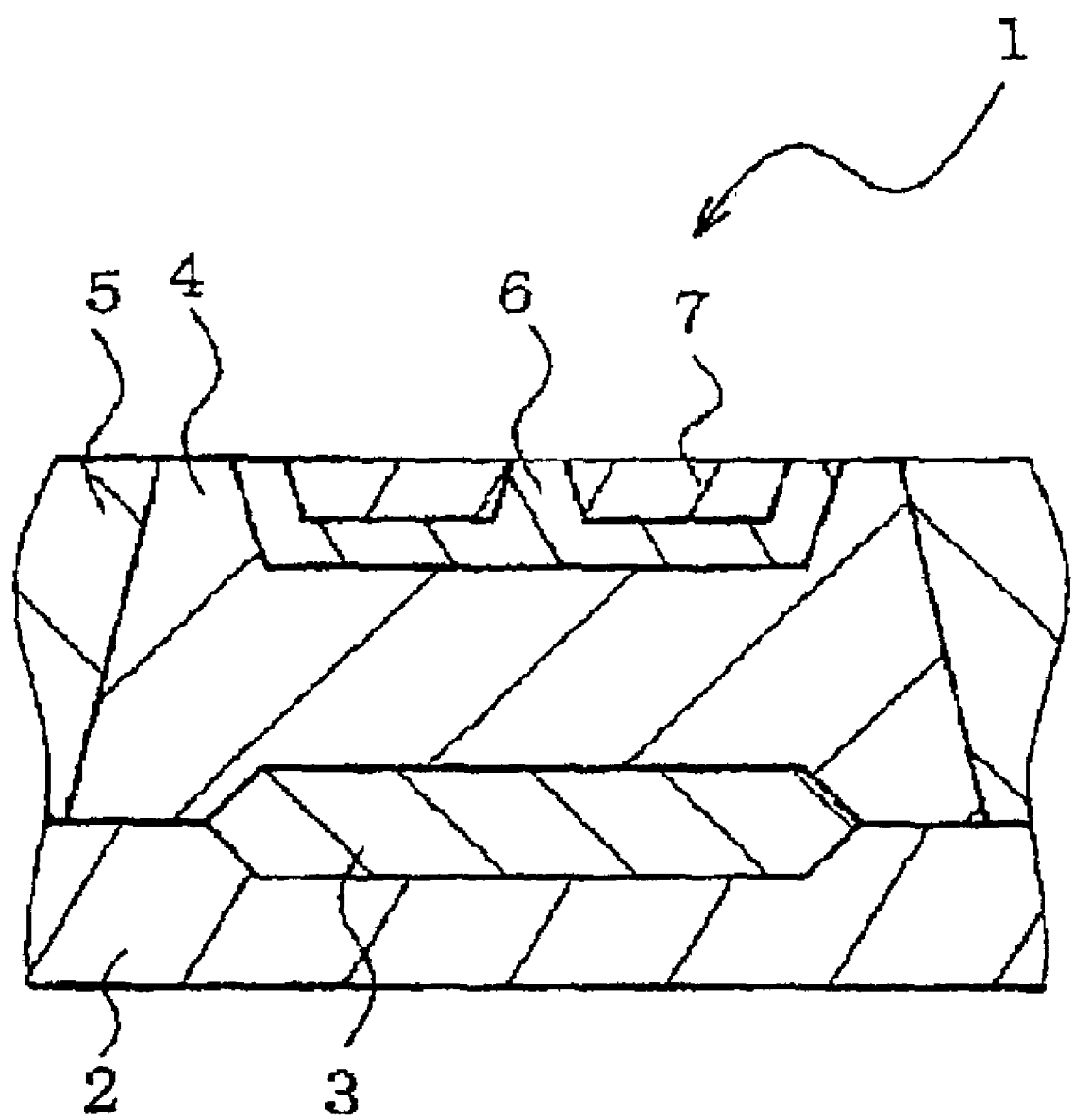
FIG. 3B is a fragmentary cross sectional elevation view, taken along an A—A line of FIG. 3A.
Figure 4A:
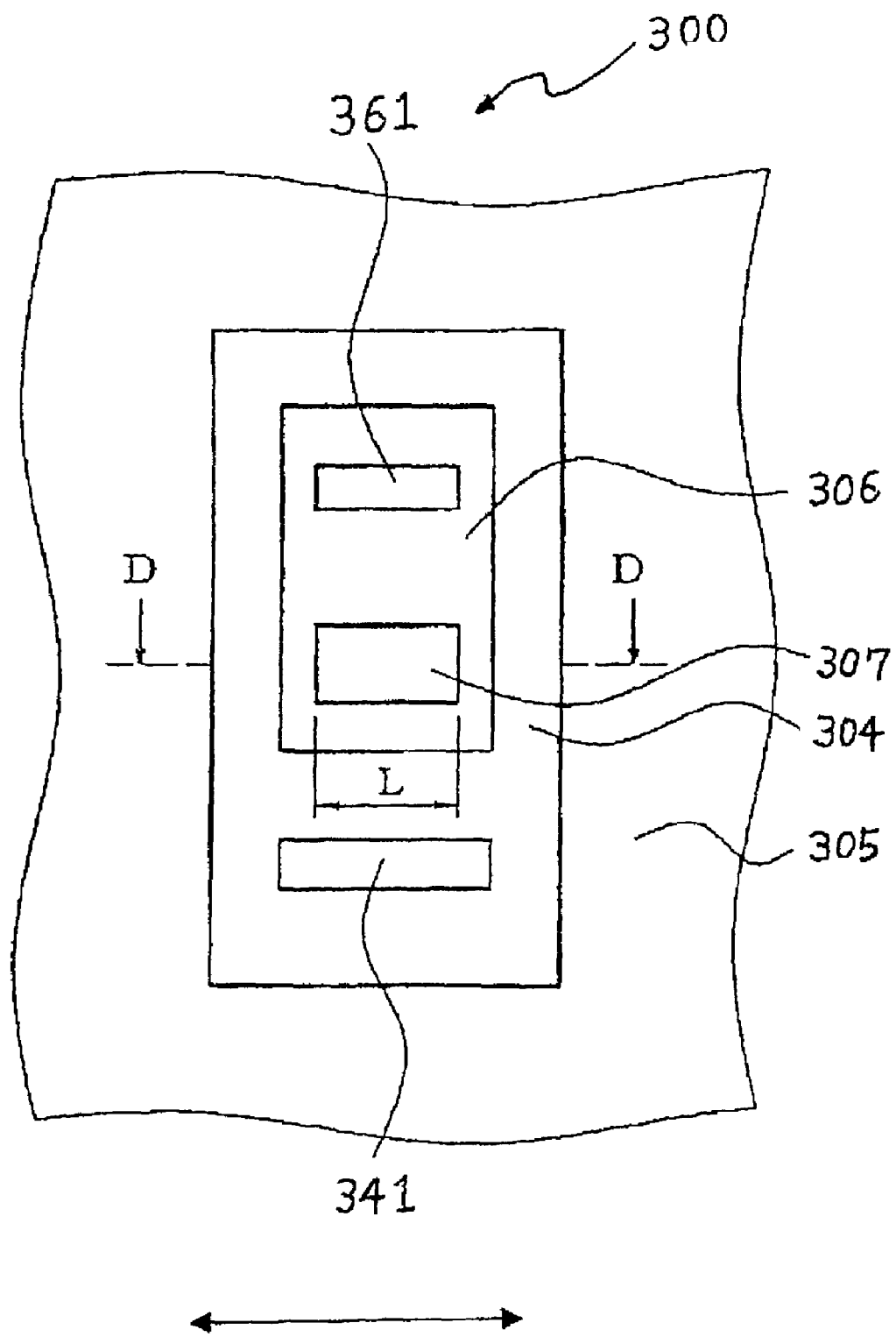
FIG. 4A is a fragmentary plan view of a typical example of a first type basic bipolar transistor, from which a second type bipolar transistor is modified in accordance with the present invention.
Figure 4B:
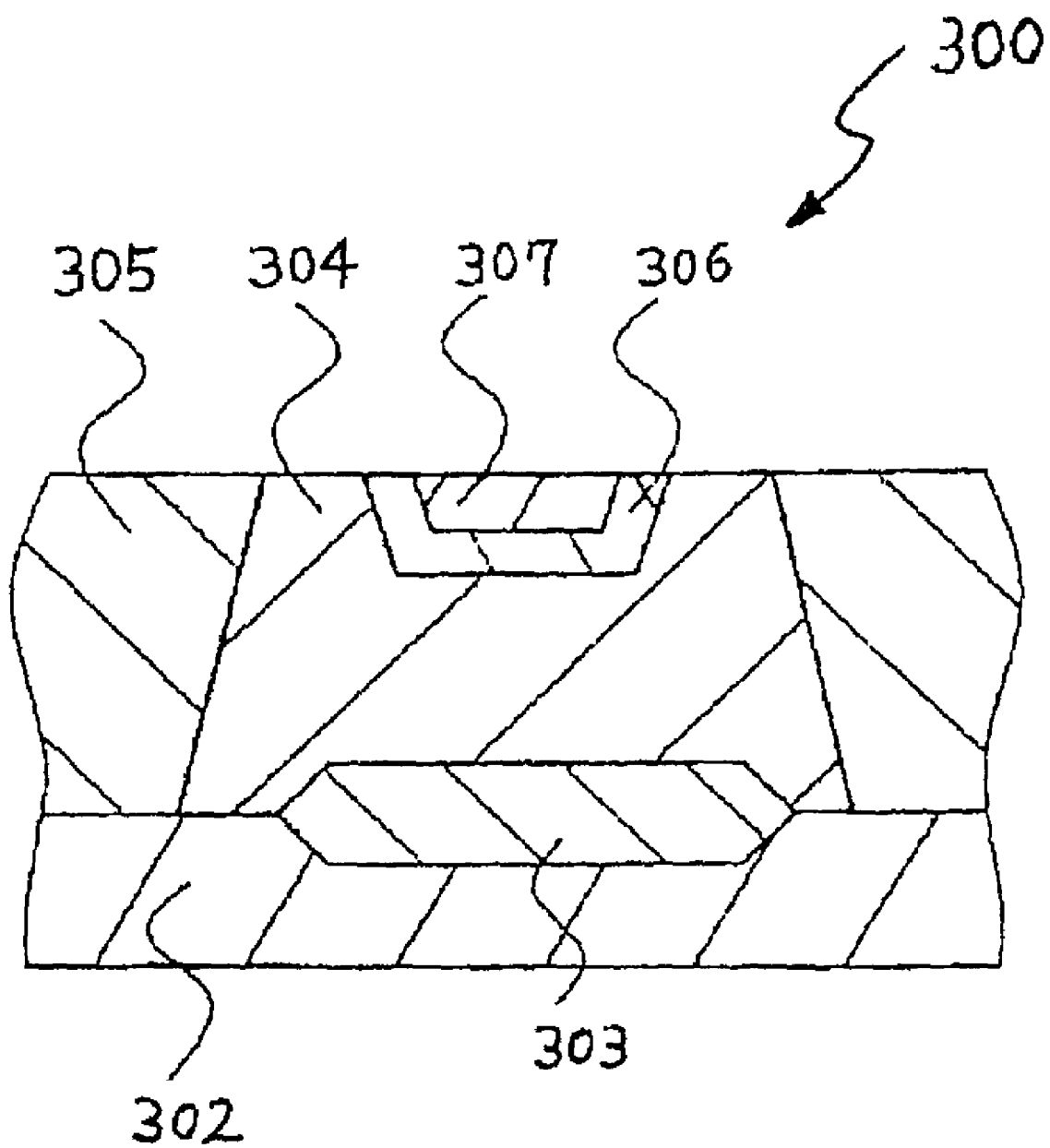
FIG. 4B is a fragmentary cross sectional elevation view, taken along a D—D line of FIG. 4A.

A typical preferred embodiment according to the present invention will be described in detail with reference to FIGS. 3A–3B and 4A–4B. The semiconductor device may include at least a first type bipolar transistor 300 as shown in FIGS. 4A and 4B and at least a second type transistor 1 as shown in FIGS. 3A and 3B. The first type bipolar transistor 300 is the basic bipolar transistor designed for providing a basic emitter current as a unit emitter current, while the second type bipolar transistor 1 is the modified bipolar transistor designed for providing a larger emitter current than the basic emitter current. As described above, the subject matter of the present invention is to improve the emitter region of the second type bipolar transistor 1 which is modified from the first type bipolar transistor 300, but not directly concerned with the first type bipolar transistor 300. The first type bipolar transistor 300 shown in FIGS. 4A and 4B may have the same structure as shown in FIGS. 2A and 2B, while the second type bipolar transistor 1 shown in FIGS. 3A and 3B may have a remarkable and distinguishable difference in structure of the emitter region from the structure as shown in FIGS. 1A and 1B.

The first type bipolar transistor 300 has the following typical structure. An n+-type buried region 303 is selectively formed over part of a p-type semiconductor substrate 302. An n-type collector region 304 is also selectively formed over both part of the p-type semiconductor substrate 302 and entirety of the n+-type buried region 303. A p-type isolation region 305 is selectively formed over part of the p-type semiconductor substrate 302 to surround and define the n-type collector region 304 in a rectangle region in the plan view. A p-type base region 306 is selectively formed in an upper region of the n-type collector region 304 in a rectangle shape in the plan view. An n+-type emitter region 307 is also selectively formed in the p-type base region 306. A base electrode contact region 361 is also selectively formed in the p-type base region 306, wherein the base electrode contact region 361 is spatially separated from the n+-type emitter region 307 by the p-type base region 306 in a first horizontal direction. A collector electrode contact region 341 is also selectively formed in the n-type collector region 304, so that the collector electrode contact region 341 is separated from the p-type base region 306 by the n-type collector region 304.

The n+-type emitter region 307 has a rectangle shape in plan view, which has a longitudinal direction represented by an arrow mark in FIG. 4A and in parallel to a second horizontal direction perpendicular to the first horizontal direction. The n+-type emitter region 307 has a basic emitter size "L" as a unit emitter size in the second horizontal direction. The emitter current generally depends on this basic emitter size "L".

The second type bipolar transistor 1 is modified from the first type bipolar transistor 300 for enabling the second type bipolar transistor 1 to provide a modified emitter current which is distinctly larger than the basic emitter current as the unit current. The second type bipolar transistor 1 has the following typical structure and as shown in FIGS. 3A and 3B. An n+-type buried region 3 is selectively formed over part of a p-type semiconductor substrate 2. An n-type collector region 4 is also selectively formed over both part of the p-type semiconductor substrate 2 and entirety of the n+-type buried region 3. A p-type isolation region 5 is selectively formed over part of the p-type semiconductor substrate 2 to surround and define the n-type collector region 4 in a rectangle region in the plan view. A p-type base region 6 is selectively formed in an upper region of the n-type collector region 4 in a rectangle shape in the plan view. An n+-type emitter region 7 is also selectively formed in the p-type base region 6. A base electrode contact region 61 is also selectively formed in the p-type base region 6, wherein the base electrode contact region 61 is spatially separated from the n+-type emitter region 7 by the p-type base region 6 in the first horizontal direction. A collector electrode contact region 41 is also selectively formed in the n-type collector region 4, so that the collector electrode contact region 41 is separated from the p-type base region 6 by the n-type collector region 4.

The n+-type emitter region 7 further comprises two divided sub-emitter regions 7 electrically isolated and spatially separated from each other in the second horizontal direction. The two divided sub-emitter regions 7 have a sub-emitter size defined in the second horizontal direction, wherein the sub-emitter size is identical with the above-described basic emitter size "L" of the first type bipolar transistor 1. The two divided sub-emitter regions 7 are aligned in the second horizontal direction. A distance between the two divided sub-emitter regions 7 may be optional, provided that such distance ensures the electrical isolation and the spatial separation, while minimization of the distance may be advantageous in view of a possible reduction in the necessary area for forming or providing the plural divided sub-emitter regions.

The base electrode contact region 61 further comprises two base electrode contact sub-regions which are also aligned in the second horizontal direction and in parallel to the above second-directional alignment of the plural divided sub-emitter regions, so that the two divided sub-emitter regions 7 have a uniform distance from the two base electrode contact sub-regions over the second horizontal direction.

As described above, the sub-emitter size of each of the two divided sub-emitter regions 7 is identical with the basic emitter size "L", while the total sum of the respective sub-emitter sizes of the two divided sub-emitter regions 7 corresponds to the intended emitter size "2L" which is larger by two times than the basic emitter size for allowing the second type bipolar transistor to provide an emitter current larger by two times than the basic emitter current from the basic emitter size "L".

This identity in the respective sub-emitter sizes of the two divided sub-emitter regions 7 to the basic emitter size "L" would give rise to substantially no drop nor decrease in the direct current amplification factor, while the total sum of the respective sub-emitter sizes of the plural divided sub-emitter regions is kept corresponding to the intended emitter current which is larger by two times than the basic emitter current from the basic emitter size "L". This results in substantially no difference between the actual emitter current obtained from the set of the plural divided sub-emitter regions and the intended emitter current, and also results in a highest accuracy of the actually obtained emitter current with reference to the intended emitter current.

As described above, a set of the above-described plural divided sub-emitter regions provides substantially the same emitter current as the intended emitter current which is distinctly larger by two times than the basic emitter current without any remarkable variation in a direct current amplification factor "Hfe" upon taking any high value of the emitter-size magnification factor. Each of the respective sub-emitter sizes "L" is distinctly smaller than or just one half of the predetermined effective emitter size "2L", but a total of the respective sub-emitter sizes is identical with the predetermined effective emitter size "2L". Accordingly, as compared to a single continuous emitter region with a predetermined effective emitter size "2L" which is distinctly larger than the basic emitter size "L" of the first type bipolar transistor 300, each of the above two divided sub-emitter regions with the respective sub-emitter sizes "L" would be identical to the basic emitter region 307 with the basic emitter size "L".

The current flowing through the base-emitter junction face is likely to depend on the base-emitter junction conditions. In the other words, the degree of prevention to the current flowing through the base-emitter junction face is likely to depend on the base-emitter junction conditions. The above-described identity of each of the above two divided sub-emitter regions to the basic emitter region 307 would allow that each of the above two divided sub-emitter regions of the modified bipolar transistor 1 has a desired identity to the basic emitter region 307 of the basic bipolar transistor 300 in view of the emitter current.

Further, as described above, the base electrode contact region 61 further comprises two base electrode contact sub-regions which are also aligned in the second horizontal direction and in parallel to the above second-directional alignment of the plural divided sub-emitter regions, so that the two divided sub-emitter regions 7 have a uniform distance from the two base electrode contact sub-regions over the second horizontal direction.

The distance between the emitter region 7 and the base electrode contact region 61 remains unchanged over the second horizontal direction. Increase in the distance between the emitter region and the base electrode contact region gives rise to increase in a parasitic resistance between the emitter and base regions 7 and 6. This increase in the parasitic resistance between the emitter and base regions 7 and 6 is disadvantageous particularly for a desired high speed performance with a large emitter current in a high frequency range. Further, the increase in another size of each of the two divided sub-emitter regions 7 in the first direction also causes an undesired increase in the parasitic resistance between the emitter and base regions 7 and 6. Accordingly, in this embodiment, for the purpose of ensuring a desired low parasitic resistance between the emitter and base regions 7 and 6, the two divided sub-emitter regions 7 are aligned in the second horizontal direction, while the two base electrode contact sub-regions are also aligned in the second horizontal direction and in parallel to the above second-directional alignment of the plural divided sub-emitter regions, to keep an optimum and uniform distance between the two divided sub-emitter regions 7 and the two base electrode contact sub-regions, and to ensure a desired low parasitic resistance advantageous particularly for desired high speed performance in the high frequency range.

The above-described parallel alignments of the two divided sub-emitter regions 7 and the two base electrode contact sub-regions in the second horizontal direction would allow simplification to additional structures not illustrated but including external contact electrodes, and particularly would be suitably available for various stacked structures or laminated structures which have been practiced in this field, to which the present invention pertains.

Also as described above, the two divided sub-emitter regions 7 and the two base electrode contact sub-regions are aligned in the single continuous base region 6 with a simple structure which may be advantageous in reducing an occupied area of the base region 6 and simplifying design and manufacturing processes for the base region.

Accordingly, the above described improved emitter structure of the emitter region 7 allows the second type bipolar transistor 1 as the modified bipolar transistor to provide an emitter current which is larger by two times than the basic emitter current from the first type bipolar transistor 300 as the basic bipolar transistor, without any substantive reduction in the direct current amplification factor "Hfe".

In the foregoing descriptions for the present embodiment, the emitter-size magnification factor of the second type bipolar transistor with reference to the first type bipolar transistor is just 2 for the purpose of simplification of the descriptions, wherein the emitter region 7 is divided into two sub-emitter regions as described above.

It should be noted that the descriptions for the present embodiment are applicable under the various conditions of the emitter-size magnification factor, namely applicable to not only 2, but also a variety of magnification factor typically 2, 4, 8 or larger integer numbers, while any non-integer numbers may be possible.

Figure 5:
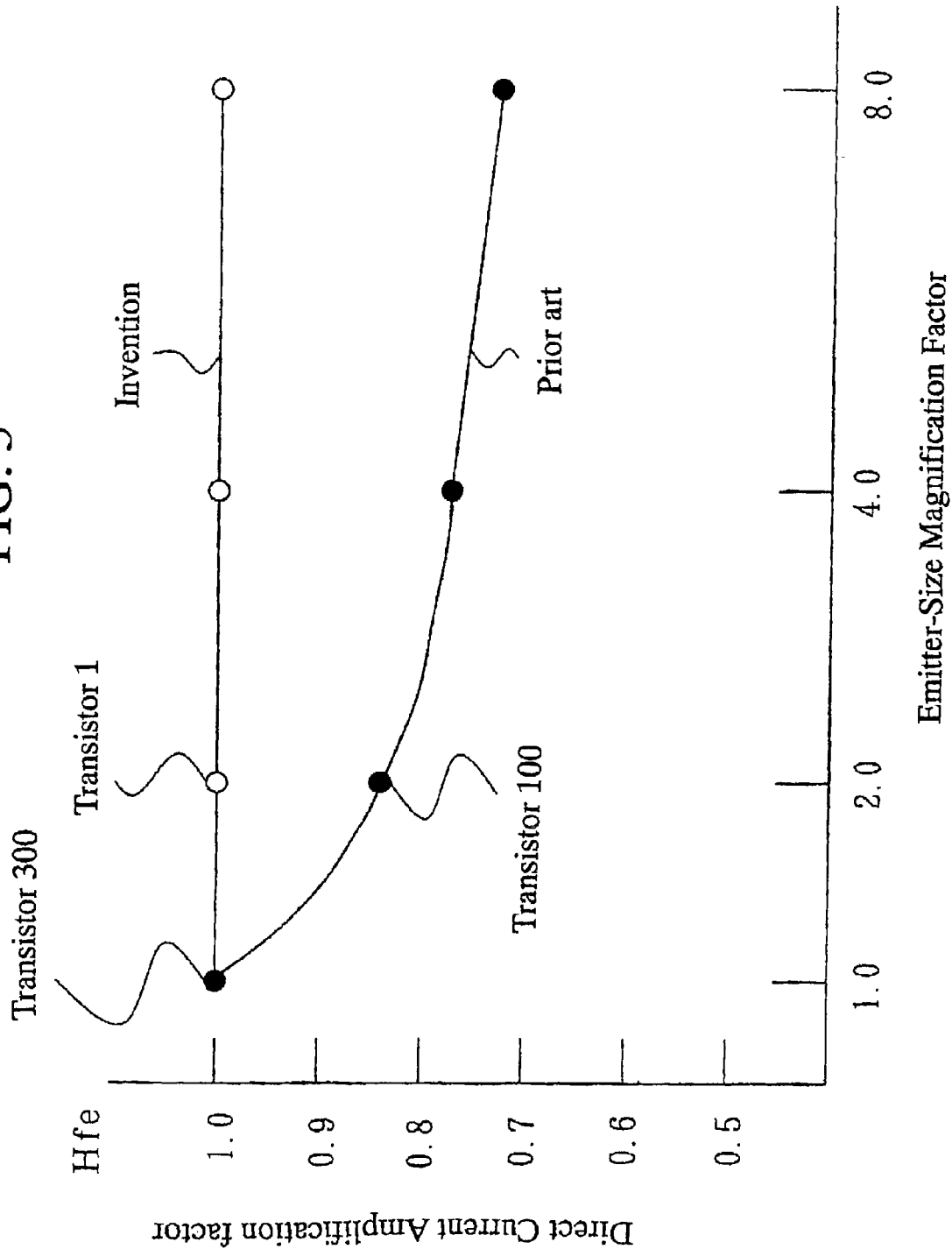
FIG. 5 is a diagram showing a relative variation in the direct current amplification factor of the second type bipolar transistor over the emitter-size magnification factor of the total emitter size of the second type bipolar transistor with reference to the basic emitter size of the first type bipolar transistor.

A relative variation in the direct current amplification factor "Hfe" of the second type bipolar transistor over the emitter-size magnification factor of the total emitter size of the second type bipolar transistor with reference to the basic emitter size of the first type bipolar transistor was investigated and is shown in FIG. 5 for both the novel second type bipolar transistor with the above-described improved emitter structure in accordance with the present invention and the conventional second type bipolar transistor 100 with the above-described known emitter region as shown in FIGS. 1A and 1B.

In FIG. 5, the vertical axis represents a relative value of the direct current amplification factor of the second type bipolar transistor with reference to the first bipolar transistor as the basic bipolar transistor, while the horizontal axis represents the emitter-size magnification factor of the modified emitter size of the modified bipolar transistor with reference to the basic emitter size of the basic bipolar transistor.

The most left-side dot mark "●" represents a reference value of direct current amplification factor defined by the basic emitter size "L" of the first type bipolar transistor 300. The remaining three dot marks "●" represent respective relative values of direct current amplification factor provided by respective larger emitter sizes "2L", "4L" and "8L" of the conventional second type bipolar transistor with the conventional emitter structure of the single continuous emitter region as shown in FIGS. 1A and 1B. Three dot marks "○" represent respective relative values of direct current amplification factor of respective larger emitter sizes "2L", "4L" and "8L" of the novel second type bipolar transistor with the improved emitter structure of the plural divided sub-emitter regions as shown in FIGS. 3A and 3B.

The conventional emitter structure of the single continuous emitter region allows simple increase in the emitter-size magnification factor to cause simple decrease or drop of the direct current amplification factor as shown by a series of the dot marks "●". This demonstrates that the conventional emitter structure is unable to keep the direct current amplification factor upon taking large value of the magnification factor, and thus unable to obtain a high accuracy in the larger emitter current.

In apparently contrast, the improved emitter structure of the plural divided sub-emitter regions allows that variation in the emitter-size magnification factor causes no decrease nor drop of the direct current amplification factor as shown by another series of the dot marks "○". This demonstrates that the improved emitter structure is able to keep the direct current amplification factor upon taking large value of the magnification factor, and thus able to obtain a high accuracy in the larger emitter current.

The identity of the respective sub-emitter sizes of the plural divided sub-emitter regions to the basic emitter size "L" allows no drop nor decrease in the direct current amplification factor "Hfe" upon taking any higher values of the emitter-size magnification factor. Notwithstanding, the similarity of the respective sub-emitter sizes to the basic emitter size "L" suppresses drop or decrease in the direct current amplification factor "Hfe" upon taking any large values of the emitter-size magnification factor. Typically, if the respective sub-emitter size is limited within the range of 0.8–1.2 times of the basic emitter size "L", then there may be obtained significant and remarkable effect of suppressing the drop or decrease in the direct current amplification factor "Hfe" upon taking any large values of the emitter-size magnification factor.

Figure 6A:
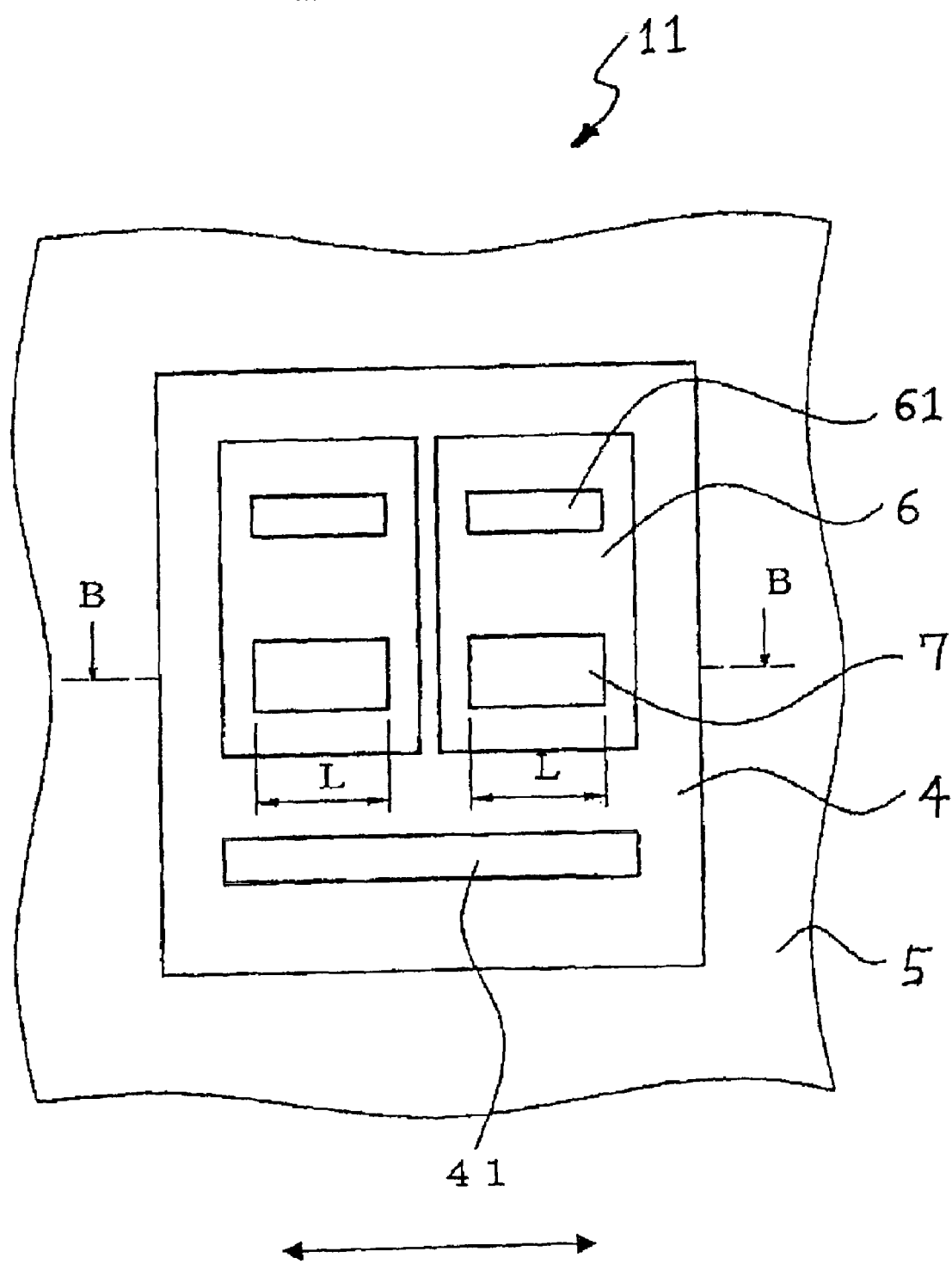
FIG. 6A is a fragmentary plan view of another typical preferred example of a second type bipolar transistor modified from a first type basic bipolar transistor in accordance with the present invention.
Figure 6B:
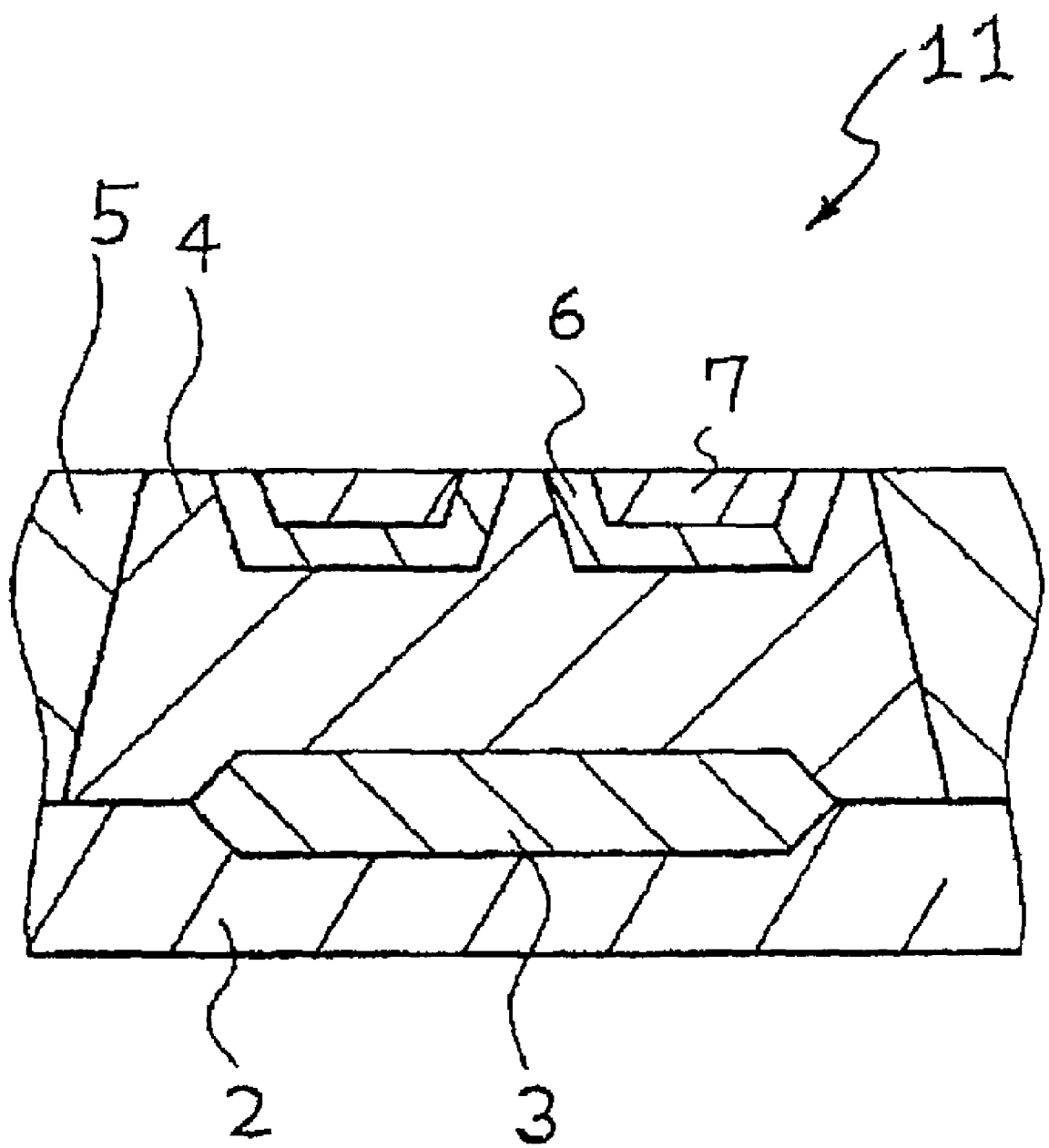
FIG. 6B is a fragmentary cross sectional elevation view, taken along a B—B line of FIG. 6A.

Another typical preferred embodiment according to the present invention will be described with reference to FIGS. 6A–6B. The semiconductor device may include at least one of the first type bipolar transistor 300 described above and shown in FIGS. 4A and 4B and at least a second type transistor 11 as shown in FIGS. 6A and 6B. The following descriptions will focus on the difference of this embodiment from the above first typical preferred embodiment. The difference is only in the structure of the base region 6 of the second type bipolar transistor 11. In the first typical preferred embodiment shown in FIGS. 3A and 3B, the base region 6 comprises the single continuous region, in which the two divided sub-emitter regions 7 and the two base electrode contact sub-regions are aligned in the second direction. In contrast, in accordance with this typical preferred embodiment, the base region 6 comprises two divided sub-base regions which are electrically isolated and spatially separated from each other in the second horizontal direction. Each set of one of the two divided sub-emitter regions 7 and one of the two base electrode contact sub-regions is provided in each of the two divided sub-base regions, wherein the two divided sub-emitter regions 7 and the two base electrode contact sub-regions are aligned in the second direction.

A distance between the two divided sub-base regions may be optional but minimization to the distance may be advantageous in a possible reduction in the necessary area for forming the two divided sub-base regions in the collector region.

Similarly to the first typical preferred embodiment, in accordance with this typical preferred embodiment, the sub-emitter size of each of the two divided sub-emitter regions 7 is identical with the basic emitter size "L", while the total sum of the respective sub-emitter sizes of the two divided sub-emitter regions 7 corresponds to the intended emitter size "2L" which is larger by two times than the basic emitter size for allowing the second type bipolar transistor to provide an emitter current larger by two times than the basic emitter current from the basic emitter size "L".

This identity in the respective sub-emitter sizes of the two divided sub-emitter regions 7 to the basic emitter size "L" would give rise to substantially no drop nor decrease in the direct current amplification factor, while the total sum of the respective sub-emitter sizes of the plural divided sub-emitter regions is kept corresponding to the intended emitter current which is larger by two times than the basic emitter current from the basic emitter size "L". This results in substantially no difference between the actual emitter current obtained from the set of the plural divided sub-emitter regions and the intended emitter current, and also results in a highest accuracy of the actual emitter current with reference to the intended emitter current.

Further, the base electrode contact region 61 further comprises two base electrode contact sub-regions which are also aligned in the second horizontal direction and in parallel to the above second-directional alignment of the plural divided sub-emitter regions, so that the two divided sub-emitter regions 7 have a uniform distance from the two base electrode contact sub-regions over the second horizontal direction.

The distance between the emitter region 7 and the base electrode contact region 61 remains unchanged over the second horizontal direction. Increase in the distance between the emitter region and the base electrode contact region gives rise to increase in a parasitic resistance between the emitter and base regions 7 and 6. This increase in the parasitic resistance between the emitter and base regions 7 and 6 is disadvantageous particularly for a desired high speed performance with a large emitter current in a high frequency range. Further, the increase in another size of each of the two divided sub-emitter regions 7 in the first direction also causes an undesired increase in the parasitic resistance between the emitter and base regions 7 and 6. Accordingly, in this embodiment, for the purpose of ensuring a desired low parasitic resistance between the emitter and base regions 7 and 6, the two divided sub-emitter regions 7 are aligned in the second horizontal direction, while the two base electrode contact sub-regions are also aligned in the second horizontal direction and in parallel to the above second-directional alignment of the plural divided sub-emitter regions, to keep an optimum and uniform distance between the two divided sub-emitter regions 7 and the two base electrode contact sub-regions, and to ensure a desired low parasitic resistance advantageous particularly for desired high speed performance in the high frequency range.

The above-described parallel alignments of the two divided sub-emitter regions 7 and the two base electrode contact sub-regions in the second horizontal direction would allow simplification to additional structures not illustrated but including external contact electrodes, and particularly would be suitably available for various stacked structures or laminated structures which have been practiced in this field, to which the present invention pertains.

Further, the two divided sub-base regions in the second horizontal direction would allow simplification to additional structures not illustrated but including external contact electrodes, and particularly would be suitably available for various stacked structures or laminated structures which have been practiced in this field.

Accordingly, the above described improved emitter structure of the emitter region 7 allows the second type bipolar transistor 11 as the modified bipolar transistor to provide an emitter current which is larger by two times than the basic emitter current from the first type bipolar transistor 300 as the basic bipolar transistor, without any substantive reduction in the direct current amplification factor "Hfe".

In the foregoing descriptions for the present embodiment, the emitter-size magnification factor is just 2 for the purpose of simplification of the descriptions, wherein the emitter region 7 is divided into two sub-emitter regions as described above.

It should also be noted that the descriptions for the present embodiment are applicable under the various conditions of the emitter-size magnification factor, namely applicable to not only 2, but also a variety of magnification factor typically 2, 4, 8 or larger integer numbers while any non-integer numbers may be possible.

The above descriptions with reference to FIG. 5 may also be applicable to this embodiment, because the respective sub-emitter size is identical with the basic emitter size "L".

Figure 7A:
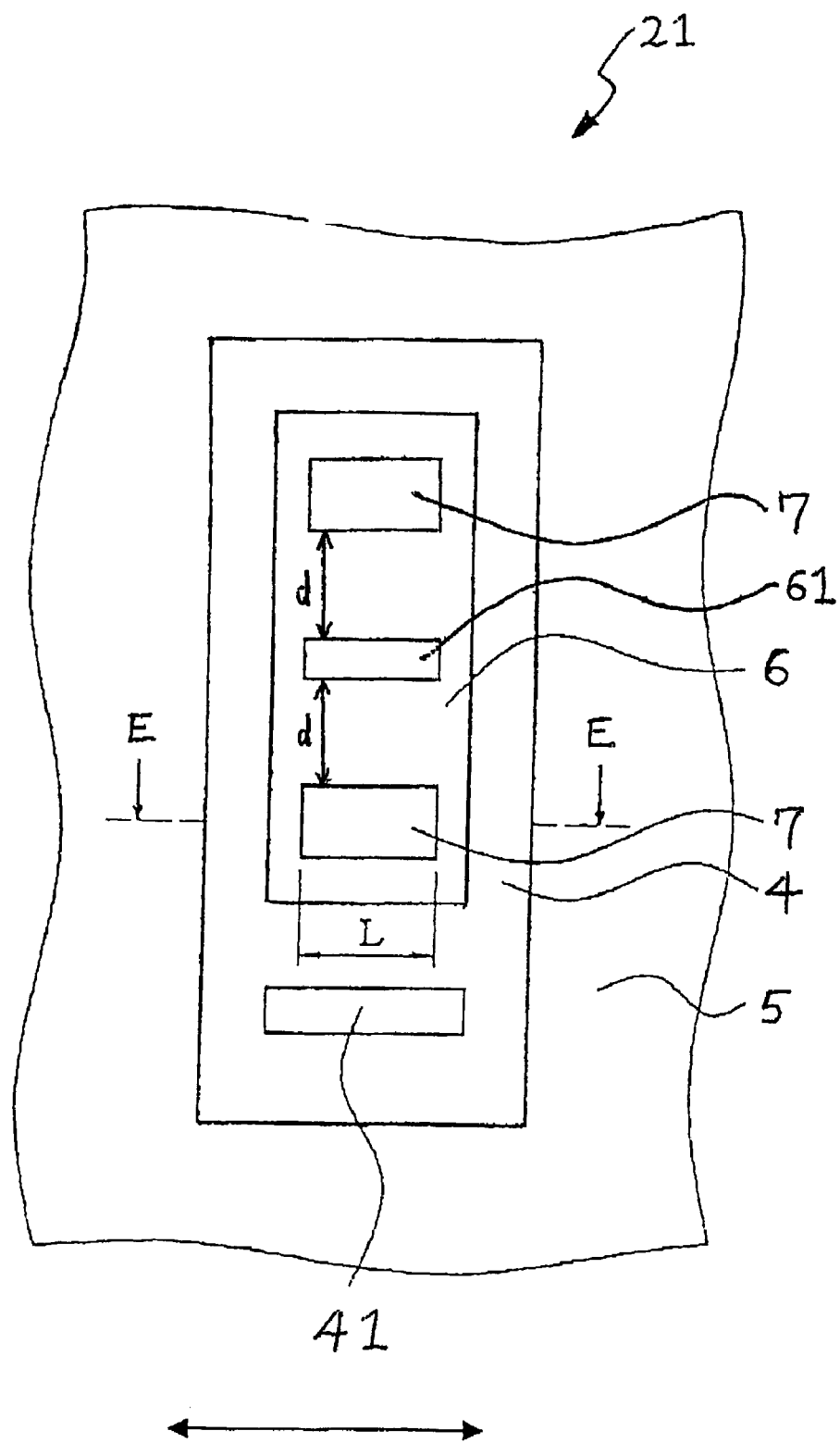
FIG. 7A is a fragmentary plan view of still another typical preferred example of a second type bipolar transistor modified from a first type basic bipolar transistor in accordance with the present invention.
Figure 7B:
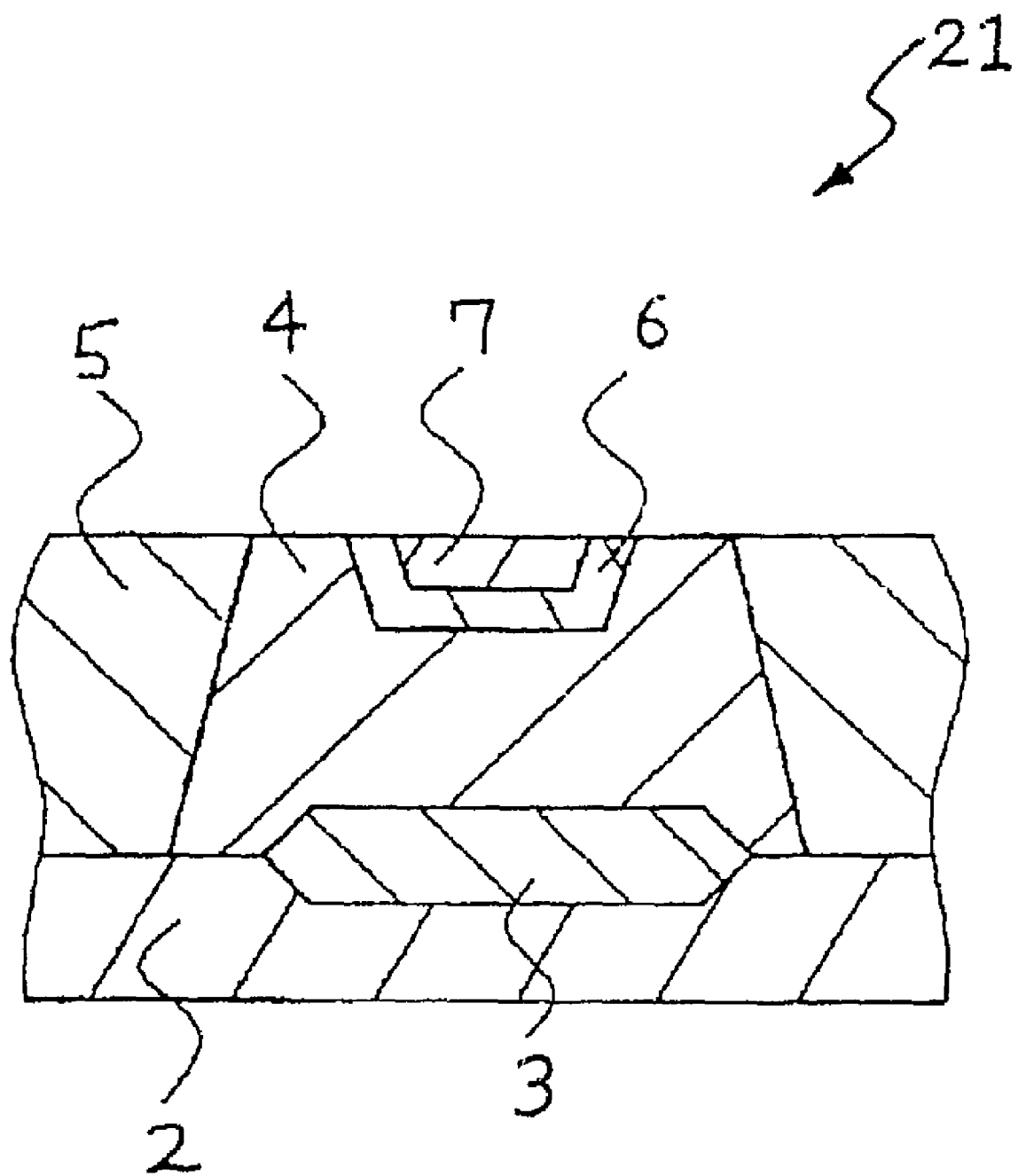
FIG. 7B is a fragmentary cross sectional elevation view, taken along an E—E line of FIG. 7A.

Still another typical preferred embodiment according to the present invention will be described with reference to FIGS. 7A–7B. The semiconductor device may include at least one of the first type bipolar transistor 300 described above and shown in FIGS. 4A and 4B and at least a second type transistor 21 as shown in FIGS. 7A and 7B. The following descriptions will focus on the difference of this embodiment from the above first typical preferred embodiment. The difference is only in the alignment direction of the plural divided sub-emitter regions of the emitter region 7 of the second type bipolar transistor 21. In the first typical preferred embodiment shown in FIGS. 3A and 3B, the emitter region 7 comprises two divided sub-emitter regions 7 which are aligned in the second horizontal direction. In contrast, in accordance with this typical preferred embodiment, the emitter region 7 comprises two divided sub-emitter regions 7 which are aligned in the first horizontal direction. A single base electrode contact region 61 and the two divided sub-emitter regions 7 are aligned in the first horizontal direction to form a single first directional alignment. In this single first directional alignment, the base electrode contact region 61 is interposed between the two divided sub-emitter regions 7. The base electrode contact region 61 is also electrically isolated and spatially separated from each of the two divided sub-emitter regions 7 in the first horizontal direction. Respective distances in the first horizontal direction of the two divided sub-emitter regions 7 from the single base electrode contact region 61 are identical with each other in order to ensure a uniform distance between the emitter region 7 and the base electrode contact region 61.

The parasitic resistance between the emitter and base regions 7 and 6 depends on the distance between the base electrode contact region 61 and the two divided sub-emitter regions 7. Further, as described above, it is preferable to keep a low parasitic resistance between the emitter and base regions 7 and 6 particularly for high speed performance in the high frequency range. For these purposes, it is preferable that respective distances between the base electrode contact region 61 and the two divided sub-emitter regions 7 are identical and kept constant. Further, the distance between the base electrode contact region 61 and the divided sub-emitter regions 7 should be decided by taking into account of a desired reduction in the parasitic resistance between the emitter and base regions 7 and 6.

In the present typical preferred embodiment, only one base electrode contact region 61 is necessary for the two divided sub-emitter regions 7. This may be advantageous in view of obtaining a possible reduction in the necessary area for forming or providing the two divided sub-emitter regions 7 and the base electrode contact region 61 as compared to the foregoing typical preferred embodiments.

Similarly to the first typical preferred embodiment, in accordance with this typical preferred embodiment, the sub-emitter size of each of the two divided sub-emitter regions 7 is identical with the basic emitter size "L", while the total sum of the respective sub-emitter sizes of the two divided sub-emitter regions 7 corresponds to the intended emitter size "2L" which is larger by two times than the basic emitter size for allowing the second type bipolar transistor to provide an emitter current larger by two times than the basic emitter current from the basic emitter size "L".

This identity in the respective sub-emitter sizes of the two divided sub-emitter regions 7 to the basic emitter size "L" would give rise to substantially no drop nor decrease in the direct current amplification factor, while the total sum of the respective sub-emitter sizes of the plural divided sub-emitter regions is kept corresponding to the intended emitter current which is larger by two times than the basic emitter current from the basic emitter size "L". This results in substantially no difference between the actual emitter current obtained from the set of the plural divided sub-emitter regions and the intended emitter current, and also results in a highest accuracy of the actually obtained emitter current with reference to the intended emitter current.

Accordingly, the above described improved emitter structure of the emitter region 7 allows the second type bipolar transistor 21 as the modified bipolar transistor to provide an emitter current which is larger by two times than the basic emitter current from the first type bipolar transistor 300 as the basic bipolar transistor, without any substantive reduction in the direct current amplification factor "Hfe".

In the foregoing descriptions for the present embodiment, the emitter-size magnification factor is just 2 for the purpose of simplification of the descriptions, wherein the emitter region 7 is divided into two sub-emitter regions as described above.

It should also be noted that the descriptions for the present embodiment are applicable under the various conditions of the emitter-size magnification factor, namely applicable to not only 2, but also a variety of magnification factor typically 2, 4, 8 or larger integer numbers but any non-integer numbers may be possible.

The above descriptions with reference to FIG. 5 may also be applicable to this embodiment, because the respective sub-emitter size is identical with the basic emitter size "L".

Figure 8A:
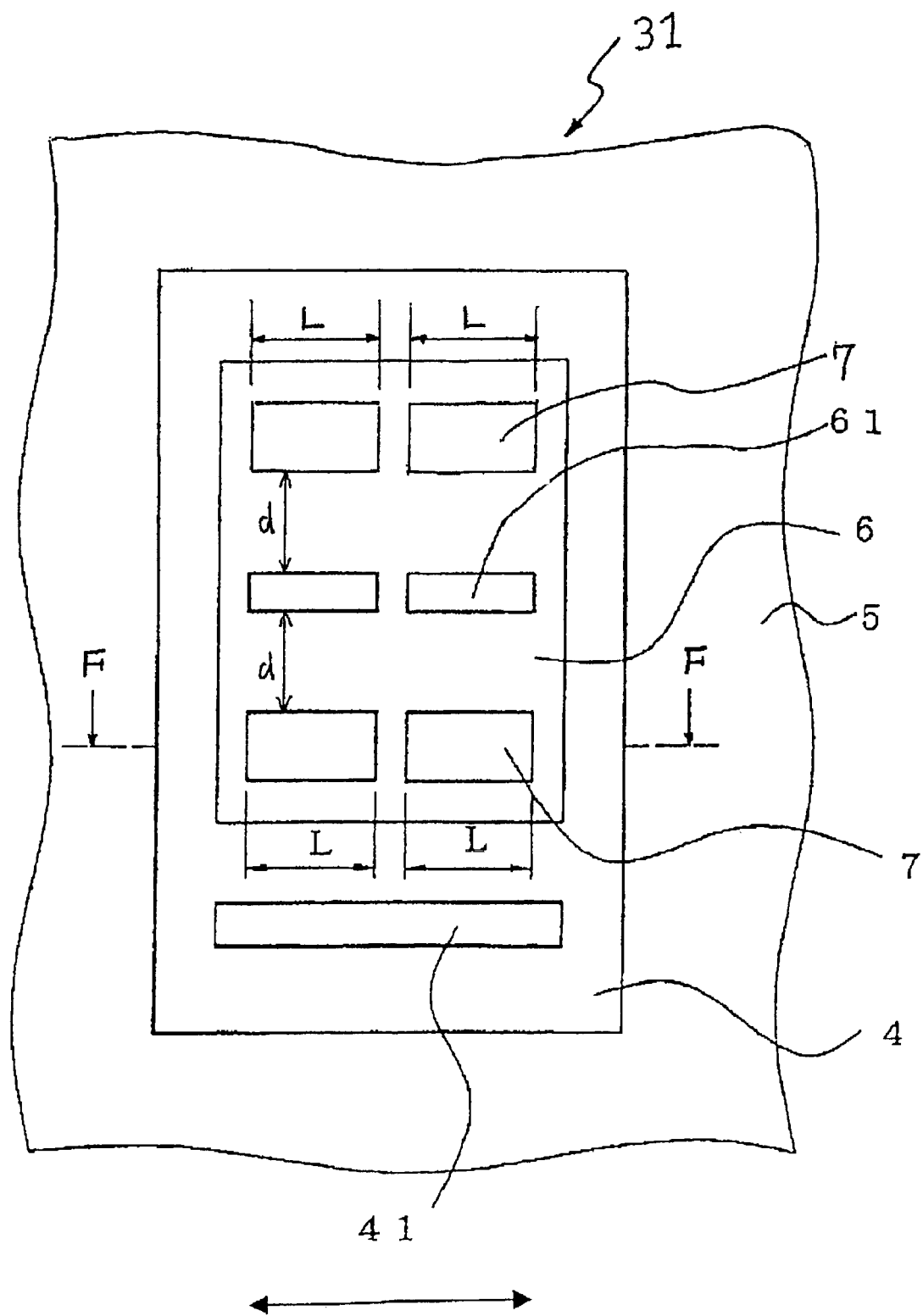
FIG. 8A is a fragmentary plan view of yet another typical preferred example of a second type bipolar transistor modified from a first type basic bipolar transistor in accordance with the present invention.
Figure 8B:
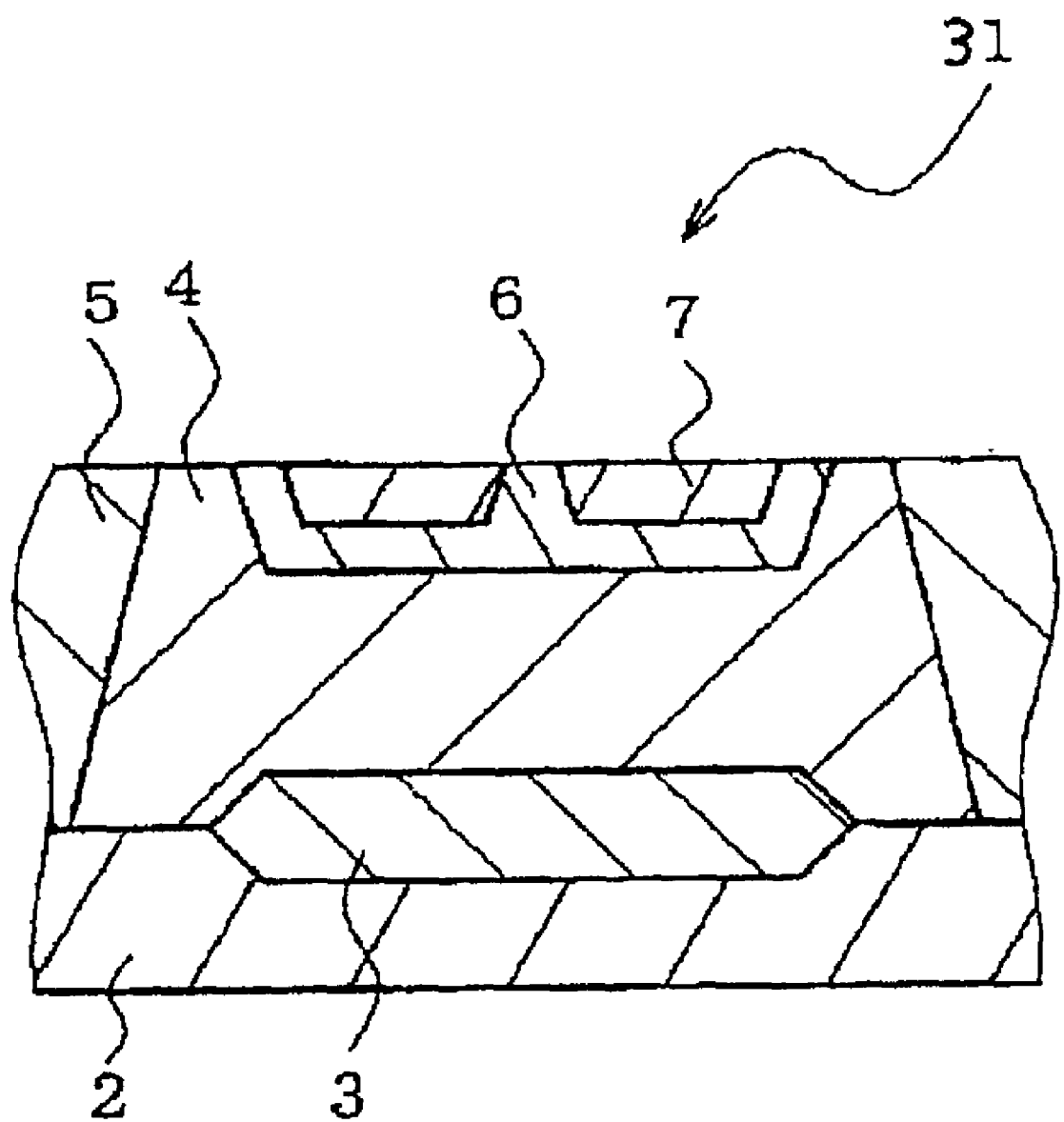
FIG. 8B is a fragmentary cross sectional elevation view, taken along an F—F line of FIG. 8A.
Figure 10:
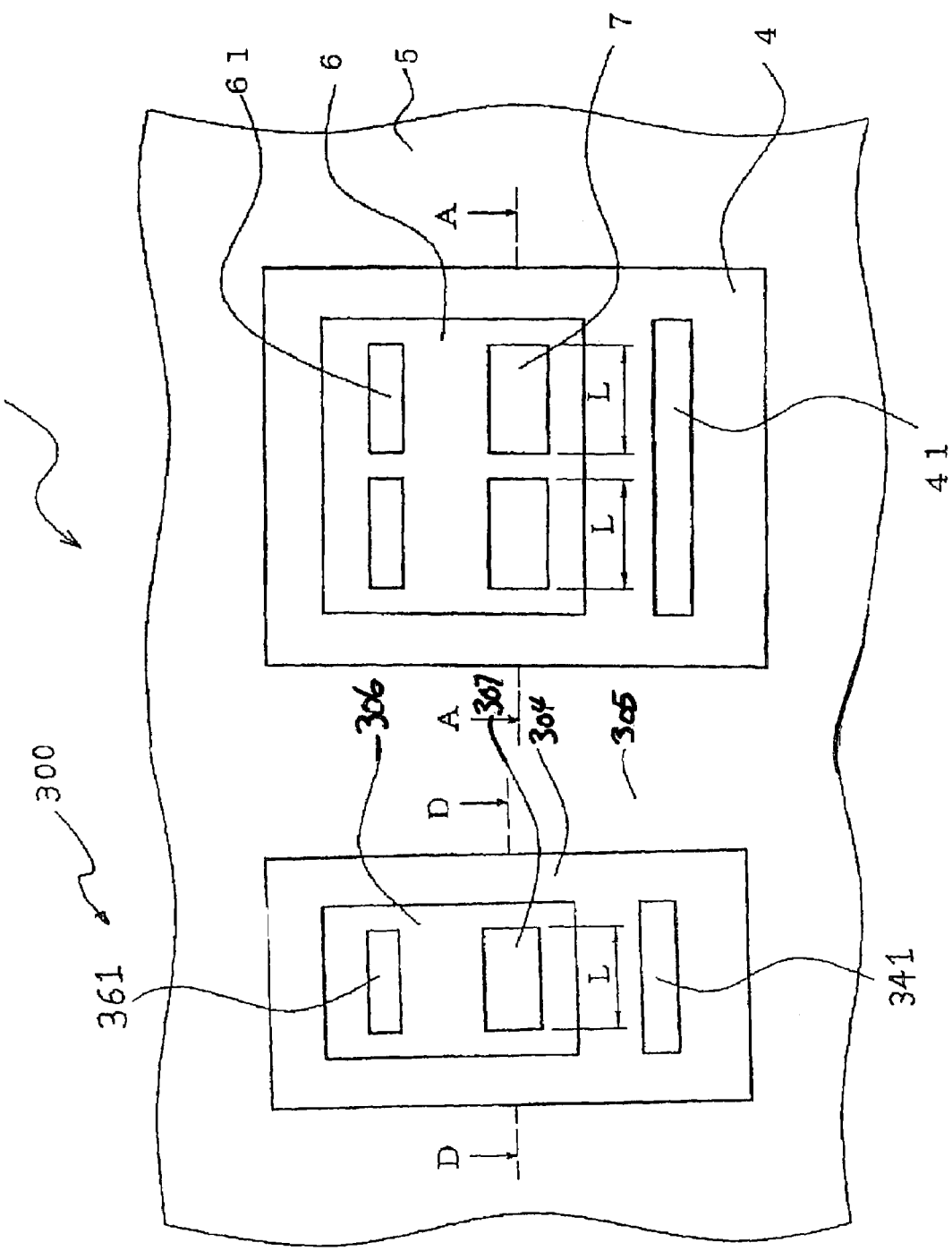
FIG. 10 combines FIGS. 3A and 4A to show the first and second type transistors side by side.
Figure 11:
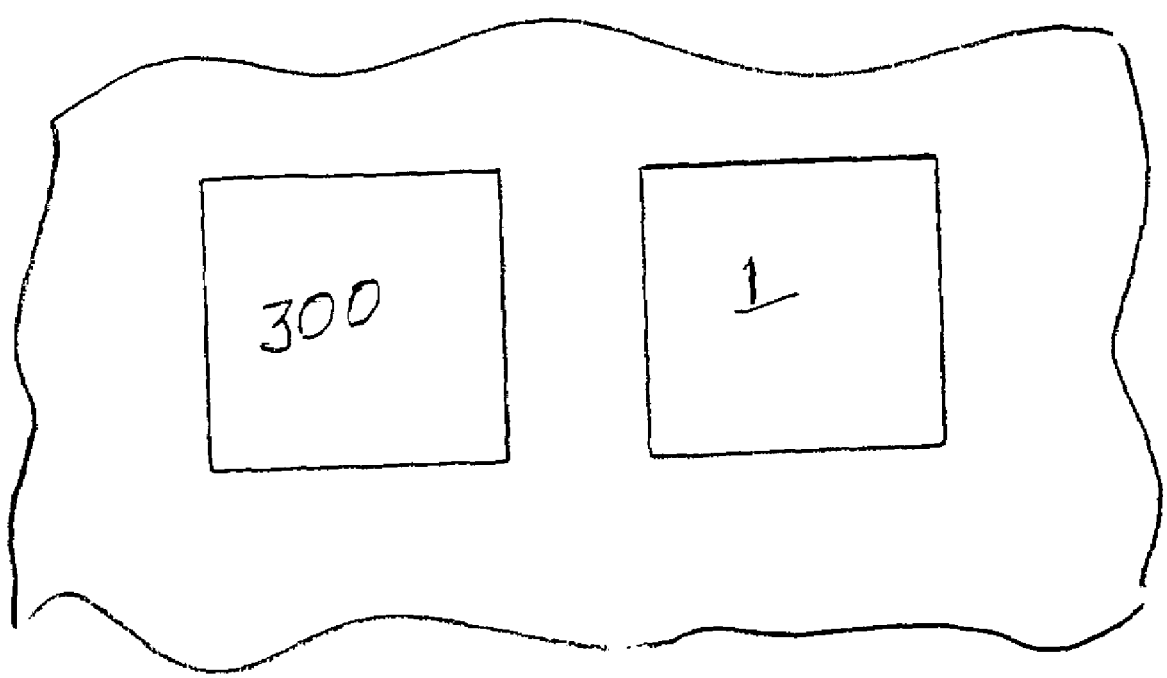
FIG. 11 generically illustrates a first type transistor 300 with a second type transistor 1.

Yet another typical preferred embodiment according to the present invention will be described with reference to FIGS. 8A–8B. The semiconductor device may include at least one of the first type bipolar transistor 300 described above and shown in FIGS. 4A and 4B and at least a second type transistor 31 as shown in FIGS. 8A and 8B. The following descriptions will focus on the difference of this embodiment from the above first typical preferred embodiment. The difference is only in the matrix alignment of the plural divided sub-emitter regions of the emitter region 7 of the second type bipolar transistor 21. In the first typical preferred embodiment shown in FIGS. 3A and 3B, the emitter region 7 comprises two divided sub-emitter regions 7 which are aligned in the second horizontal direction.

In contrast, in accordance with this typical preferred embodiment, the emitter region 7 comprises four divided sub-emitter regions 7 which are aligned in the 2×2 matrix. Two base electrode contact sub-regions 61 and the four divided sub-emitter regions 7 are aligned in the 3×2 matrix. The two base electrode contact sub-regions 61 are aligned in the second horizontal direction. The four divided sub-emitter regions 7 are aligned in the second horizontal direction to form dual alignments in the second horizontal direction. Namely, first-two of the four divided sub-emitter regions 7 form a first alignment in the second horizontal direction, and second-two of the four divided sub-emitter regions 7 form a second alignment in the second horizontal direction. The above single alignment in the second horizontal direction of the two base electrode contact sub-regions 61 is interposed between the above first and second alignments in the second horizontal direction of the four divided sub-emitter regions 7. Respective distances in the first horizontal direction between the center single alignment of the two base electrode contact sub-regions 61 and the above dual alignments of the four divided sub-emitter regions 7 are identical with each other in order to ensure a uniform distance between the emitter region 7 and the base electrode contact region 61.

The two base electrode contact sub-regions 61 are spatially separated from each other in the second direction. A distance between the two base electrode contact sub-regions 61 in the second direction may be optional, but minimization to this distance may be advantageous for a possible reduction in a width along the second direction of the necessary area for forming or providing the two base electrode contact sub-regions 61.

The first-two of the four divided sub-emitter regions 7 are also electrically isolated and spatially separated from each other in the second direction. A distance between the first-two of the four divided sub-emitter regions 7 may also be optional, but minimization to this distance may also be advantageous for a possible reduction in a width along the second direction of the necessary area for forming or providing the first-two of the four divided sub-emitter regions 7.

The second-two of the four divided sub-emitter regions 7 are also electrically isolated and spatially separated from each other in the second direction. A distance between the second-two of the four divided sub-emitter regions 7 may also be optional, but minimization to this distance may also be advantageous for a possible reduction in a width along the second direction of the necessary area for forming or providing the second-two of the four divided sub-emitter regions 7.

It should be noted that the above three distances in the second directions between the two base electrode contact sub-regions 61 and between the first-two of the four divided sub-emitter regions 7 as well as between the second-two of the four divided sub-emitter regions 7 are identical with each other, so as to form other dual alignments in the first horizontal direction. Each of the other dual alignments in the first horizontal direction comprises one of the two base electrode contact sub-regions 61 and two of the four divided sub-emitter regions 7, wherein one of the two base electrode contact sub-regions 61 is interposed between two of the four divided sub-emitter regions 7.

Similarly to the first typical preferred embodiment, in accordance with this typical preferred embodiment, the sub-emitter size of each of the four divided sub-emitter regions 7 is identical with the basic emitter size "L", while the total sum of the respective sub-emitter sizes of the four divided sub-emitter regions 7 corresponds to the intended emitter size "4L" which is larger by four times than the basic emitter size for allowing the second type bipolar transistor to provide an emitter current larger by four times than the basic emitter current from the basic emitter size "L".

This identity in the respective sub-emitter sizes of the four divided sub-emitter regions 7 to the basic emitter size "L" would give rise to substantially no drop nor decrease in the direct current amplification factor, while the total sum of the respective sub-emitter sizes of the plural divided sub-emitter regions is kept corresponding to the intended emitter current which is larger by four times than the basic emitter current from the basic emitter size "L". This results in substantially no difference between the actual emitter current obtained from the set of the plural divided sub-emitter regions and the intended emitter current, and also results in a highest accuracy of the actual emitter current with reference to the intended emitter current.

As described above, the distance in the first horizontal direction between the emitter region 7 and the base electrode contact region 61 remains unchanged. Increase in the distance between the emitter region 7 and the base electrode contact region 61 in the first horizontal direction gives rise to increase in a parasitic resistance between the emitter and base regions 7 and 6. This increase in the parasitic resistance between the emitter and base regions 7 and 6 is disadvantageous particularly for a desired high speed performance with a large emitter current in a high frequency range. Further, the increase in another size of each of the fourth divided sub-emitter regions 7 in the first direction also causes an undesired increase in the parasitic resistance between the emitter and base regions 7 and 6. Accordingly, in this embodiment, for the purpose of ensuring a desired low parasitic resistance between the emitter and base regions 7 and 6, the dual alignments of the first-two and the second-two of the four divided sub-emitter regions 7 extend in opposite sides of the single center alignment of the two base electrode contact sub-regions 61 in the second horizontal direction, to keep an optimum and uniform distance between the four divided sub-emitter regions 7 and the two base electrode contact sub-regions 61, and also to ensure a desired low parasitic resistance advantageous particularly for desired high speed performance in the high frequency range.

The above-described matrix alignments of the four divided sub-emitter regions 7 and the two base electrode contact sub-regions 61 would allow simplification to additional structures not illustrated but including external contact electrodes, and particularly would be suitably available for various stacked structures or laminated structures which have been practiced in this field, to which the present invention pertains.

Accordingly, the above described improved emitter structure of the emitter region 7 allows the second type bipolar transistor 31 as the modified bipolar transistor to provide an emitter current which is larger by two times than the basic emitter current from the first type bipolar transistor 300 as the basic bipolar transistor, without any substantive reduction in the direct current amplification factor "Hfe".

In the foregoing descriptions for the present embodiment, the emitter-size magnification factor is just 4 for the purpose of simplification of the descriptions, wherein the emitter region 7 is divided into four sub-emitter regions as described above.

In this example, the base region 6 comprises a single continuous region in which the matrix alignments of the four divided sub-emitter regions 7 and the two base electrode contact sub-regions 61 are provided. It is, however, possible as a modification that similarly to the second embodiment as shown in FIGS. 6A and 6B, the base region 6 may comprise two divided sub-base regions 6, so that the above-described each alignment in the first horizontal direction including the one base electrode contact sub-region 61 and the two divided sub-emitter regions 7 is provided on the each sub-base region 6.

It should also be noted that the descriptions for the present embodiment are applicable under the various conditions of the emitter-size magnification factor, namely applicable to not only 4, but also a variety of magnification factor typically 4, 8, 16 or larger integer numbers but any non-integer numbers may be possible.

The above descriptions with reference to FIG. 5 may also be applicable to this embodiment, because the respective sub-emitter size is identical with the basic emitter size "L".

An additional typical preferred embodiment according to the present invention will be described with reference to FIG. 9, wherein a suggestion is made for a novel process for designing the above described second type bipolar transistor 1 shown in FIGS. 3A and 3B based on the first type bipolar transistor 300 shown in FIGS. 4A and 4B. The subject mater of the present invention is to design the improved emitter region 7 of the second type bipolar transistor 1 on the basis of the first type emitter region 307 of the first type bipolar transistor 300. The process may include the following steps.

In a first step S1, a first type emitter region 307 of the first type bipolar transistor 300 is designed, wherein the first type emitter region 307 has a basic emitter size "L" as a unit emitter size for a basic emitter current as a unit emitter current.

In a second step S2, an emitter size magnification factor "n" is calculated.

In a third step S3, an emitter region 7 of the second type bipolar transistor 1 is provisionally defined by enlarging, at the calculated emitter-size magnification factor "n", the first type emitter region 307 of the first type bipolar transistor 300 in the second horizontal direction, so that the emitter region 7 has a modified emitter size "nL" which is larger by the calculated emitter-size magnification factor "n" than the basic emitter size In a fourth step S4, the enlarged emitter region 7 is divided into plural divided sub-emitter regions so that each of the plural divided sub-emitter regions has the same emitter size as the basic emitter size "L".

In a fifth step S5, the plural divided sub-emitter regions are advantageously placed or arranged in a base region 6 of the second type bipolar transistor 1.

The above fifth step S5 for placement or arrangement may advantageously align the plural divided sub-emitter regions either in the second horizontal direction, or in the first horizontal direction, or in matrix.

It is convenient that the emitter-size magnification factor "n" is set at the natural number more than 1. If the calculated emitter-size magnification factor "n" in the second step S2 is a numerical value with one or more places of decimals, it may, if desired, be possible to round this numerical value off to the nearest whole number for the purpose of further facilitation of the design process.

Further, it will be apparent to a person having ordinary skill in the art that the above-described novel design method may be implemented by any available software or hardware tools, typically including, but not limited to, a computer-readable program to be installed into any general-purpose or personal computer or any dedicated hardware tool.

In the foregoing embodiments, the descriptions have been made assuming that both the first type and second type bipolar transistors are n-p-n bipolar transistors. It will be apparent to a person having ordinary skill in the art that the present invention be also applicable to p-n-p bipolar transistors.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A device structure comprising:
   an isolation region completely surrounding a single continuous collector region of only a single transistor;
   a discontinuous base region located within said collector region, said discontinuous base region comprising plural divided sub-base regions spatially separated from each other;
   a base electrode contact region located within the base region, said base electrode contact region comprising plural divided base electrode contact sub-regions spatially separated from each other; and
   an emitter region located within the discontinuous base region, said emitter region comprising plural divided sub-emitter regions spatially separated from each other, said plural divided sub-emitter regions being also spatially separated, at least in a plan view first direction, from the base electrode contact region,
   said plural divided sub-emitter regions having respective sub-emitter lengths defined in a plan view second direction perpendicular to said first direction, and a total sum of said respective sub-emitter lengths corresponds to a predetermined effective emitter length defined in said second direction for an intended emitter current from said emitter region,
   wherein said respective sub-emitter lengths are within a range of 0.8 times to 1.2 times of a predetermined basic emitter length defined as a unit emitter length for a basic emitter current as a unit emitter current,
   wherein said plural divided sub-emitter regions are aligned in said second direction as a second-direction grouping,
   wherein the plural base electrode contact sub-regions are aligned in said second direction and in parallel to said second-direction grouping of said plural divided sub-emitter regions, and said plural divided sub-emitter regions have a uniform distance from said plural base electrode contact sub-regions over said second direction, and wherein said plural divided sub-base regions are aligned in said second direction, and a set of one of said plural base electrode contact sub-regions and one of said plural divided sub-emitter regions is provided in each of said plural divided sub-base regions.

2. The device structure of claim 1, wherein, within each sub-base region, all said divided sub-emitter regions are aligned in registration in the first direction with said one base electrode contact sub-region and none of said divided sub-emitter regions are aligned in registration with said one base electrode contact in the second direction, and further comprising a collector within said collector region and in registration in the first direction with each sub-base region.

3. A device structure comprising:

an isolation region completely surrounding a single continuous collector region of only a single transistor, the single transistor having a plan view first direction and a plan view second direction, the second direction being coplanar and perpendicular to the first direction;

a base region located within said collector region;

a base electrode contact region located with the base region, said base electrode contact region comprising plural divided base electrode contact sub-regions spatially separated from each other and aligned in the second direction; and an emitter region located within the base region, said emitter region comprising plural divided sub-emitter regions spatially separated from each other, said plural divided sub-emitter regions being also spatially separated, at least in the first direction, from the base electrode contact region, and said plural divided sub-emitter regions having respective sub-emitter lengths defined in the second direction, and a total sum of said respective sub-emitter lengths corresponds to a predetermined effective emitter length defined in said second direction for an intended emitter current from said emitter region, wherein, said respective sub-emitter lengths are within a range of 0.8 times to 1.2 times of a predetermined basic emitter length defined as a unit emitter length for a basic emitter current as a unit emitter current, said plural divided sub-emitter regions are aligned in a matrix, plural first direction groupings extend in said first direction, each of said plural first direction groupings comprising a set of said at least one divided base electrode contact sub-region located intermediate two of said plural divided sub-emitter regions, in each of said plural first direction groupings, said one divided base electrode contact region and each of said plural divided sub-emitter regions are adjacent to each other but spatially separated from each other at a uniform distance, and said plural first direction groupings are aligned in the second direction.

4. The device structure of claim 3, wherein, within each sub-base region, all said divided sub-emitter regions are aligned in registration in the first direction with said one base electrode contact subregion and none of said divided sub-emitter regions are aligned in registration with said one base electrode contact in the second direction, and further comprising a collector contact within said collector region and in registration in the first direction with each sub-base region.

* * * * *